(12) United States Patent
Furse et al.

(10) Patent No.: US 7,495,450 B2
(45) Date of Patent: Feb. 24, 2009

(54) DEVICE AND METHOD FOR DETECTING ANOMOLIES IN A WIRE AND RELATED SENSING METHODS

(75) Inventors: Cynthia Furse, Salt Lake City, UT (US); John Mahoney, Godfrey, IL (US); You Chung Chung, Salt Lake City, UT (US); Nirmal Nath Amarnath, Salt Lake City, UT (US)

(73) Assignee: University of Utah Research Foundation, Salt Lake City, UT (US)

(*) Notice: Subject to any disclaimer, the term of this patent is extended or adjusted under 35 U.S.C. 154(b) by 115 days.

(21) Appl. No.: 11/133,145

(22) Filed: May 18, 2005
(Under 37 CFR 1.47)

(65) Prior Publication Data
US 2006/0061368 A1  Mar. 23, 2006

Related U.S. Application Data

(63) Continuation-in-part of application No. PCT/US03/37233, filed on Nov. 19, 2003.

(60) Provisional application No. 60/427,737, filed on Nov. 19, 2002, provisional application No. 60/455,788, filed on Mar. 18, 2003, provisional application No. 60/459,482, filed on Mar. 31, 2003, provisional application No. 60/477,391, filed on Jun. 9, 2003.

(51) Int. Cl.
*G01R 31/08* (2006.01)

(52) U.S. Cl. .................... 324/519; 324/525

(58) Field of Classification Search ................ 324/519, 324/527, 528, 658, 525
See application file for complete search history.

(56) References Cited

U.S. PATENT DOCUMENTS

| | | | | |
|---|---|---|---|---|
| 3,354,386 A * | 11/1967 | Daigle et al. | ................. | 324/515 |
| 3,705,346 A * | 12/1972 | Jedvall et al. | ................ | 324/526 |
| 4,011,508 A | 3/1977 | Gabor | ......................... | 324/133 |
| 4,559,491 A * | 12/1985 | Saha | ............................ | 324/522 |
| 4,743,753 A | 5/1988 | Cheng et al. | ................ | 356/73.1 |
| 4,812,752 A * | 3/1989 | Preuss | ......................... | 324/542 |
| 5,276,703 A | 1/1994 | Budin et al. | ................. | 325/130 |
| 5,699,402 A * | 12/1997 | Bauer et al. | ............... | 379/29.09 |
| 5,754,053 A * | 5/1998 | Bourdeau | .................... | 324/533 |
| 5,760,590 A * | 6/1998 | Striffler | ...................... | 324/514 |
| 5,977,773 A * | 11/1999 | Medelius et al. | ............ | 324/520 |
| 6,008,654 A | 12/1999 | Chaskell | ...................... | 324/519 |
| 6,636,048 B2 | 10/2003 | Sciacero et al. | ............. | 324/520 |
| 6,646,447 B2 | 11/2003 | Cern et al. | ................... | 324/539 |
| 6,798,211 B1 * | 9/2004 | Rockwell et al. | ............ | 324/527 |
| 2002/0167303 A1 * | 11/2002 | Nakano | ...................... | 324/126 |
| 2004/0245994 A1 * | 12/2004 | Schlapp et al. | .............. | 324/500 |

FOREIGN PATENT DOCUMENTS

GB  2317707 A * 4/1998

\* cited by examiner

*Primary Examiner*—Vincent Q Nguyen
(74) *Attorney, Agent, or Firm*—Kirton & McConkie; William T. Ralston

(57) ABSTRACT

A device and method provides for measuring the electrical properties of electronic signal paths, including wires and wireless channels. The device can be used for detecting open circuits, short circuits, and the lengths of wires. The device can include a sensor configured to measure a bulk electrical inductance of said wire to produce a measurement result and a processor configured to extract a length of the wire from the measurement result of the sensor.

33 Claims, 31 Drawing Sheets

DEVICE AND METHOD FOR DETECTING ANOMOLIES IN A WIRE AND RELATED SENSING METHODS

CROSS-REFERENCE TO RELATED APPLICATIONS AND CLAIM OF PRIORITY

This application is a continuation-in-part of copending PCT Application No. PCT/US03/37233 filed on 19 Nov. 2003 entitled "Device and Method for Detecting Anomolies in a Wire and Related Sending Methods," which claims the benefit of U.S. application Ser. No. 60/427,737 filed on 19 Nov. 2002 entitled "Handheld Device for Detecting Open, Short and Location of Anomaly on a Wire," U.S. application Ser. No. 60/455,788 filed on 18 Mar. 2003 entitled Noise Domain Reflectometer Apparatus and Method for Determining the Integrity and/or Lengths of Signal Paths," U.S. application Ser. No. 60/459,482 filed on 31 Mar. 2003 entitled "Mixed Signal Reflectometer Apparatus and Method for Determining the Integrity of Signal Paths," and U.S. application Ser. No. 60/477,391 filed on 9 Jun. 2003 entitled "Method and System for Robust Multi-Carrier Spread Spectrum Data Transmission over Partially Jammed Channels." All of the above applications are hereby incorporated by reference for all that they disclose and for all purposes.

BACKGROUND OF THE INVENTION

1. Field of the Invention

This invention relates generally to the detection and localization of anomalies on cables and wires (hereinafter referred to as wires). More specifically, the invention relates to the characterization of wires, wherein characterization includes determination of wire length, impedance (characterized as open circuits and short circuits), the location of the open and short circuits, including intermittent opens and shorts, mapping, capacitance, inductance, resistance, and identifying and locating other anomalies on the wire, including chafes, frays, corrosion, and fluid bridging, that may be indicative of damage.

2. Description of Related Art

The field of the invention has introduced a broad list of applications of the present invention. It is necessary to provide this broad list to ensure that it is understood that the nature of the invention is such that there are many uses, only some of which are disclosed herein. Nevertheless, it is useful to keep in mind from the outset that the present invention, while teaching several useful embodiments, is adaptable to determining a broad range of highly valuable wire characteristics in a manner that is unknown in industry today. Thus, it will be shown that the present invention is capable of highly accurate and detailed determination of wire characteristics in a highly cost efficient and convenient manner.

The title of the present invention is focused on one particular aspect of the present invention that is going to be taught in detail. However, the scope of the present invention includes all of the items described in the field of invention.

A brief summary of the importance of the present invention can be illustrated by examining the critical nature of wires in industry and commerce. The modern world uses electrical devices that must operate reliably. Aircraft are a particularly poignant example of a structure that cannot afford to have failures in electrical systems. Unfortunately, testing wires can actually cause more harm if the wires must be removed for inspection. Even if the wires are functioning properly upon inspection, reinsertion of the wires into the body of the aircraft can result in the damage that is trying to be avoided.

Furthermore, detecting many of the above-described anomalies is difficult to accomplish with visual inspections. Thus, what is needed is a reliable, easy-to-use, cost effective, and accurate system for testing wires that does not require movement of the wires in order to perform testing.

BRIEF SUMMARY OF THE INVENTION

In a preferred embodiment, the present invention is a handheld device having a timer circuit for testing integrity of a wire, wherein a circuit is taught that enables determination of the location of a short circuit, open circuit, or other anomaly on a wire, and wherein the timer circuit can be provided as a retro-fit of an existing handheld device, or as an integral unit.

In another aspect of the present invention, a handheld device is taught for testing integrity of a wire wherein the device may be used for testing while the wire has signals present associated with an operating system.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Figure 1:
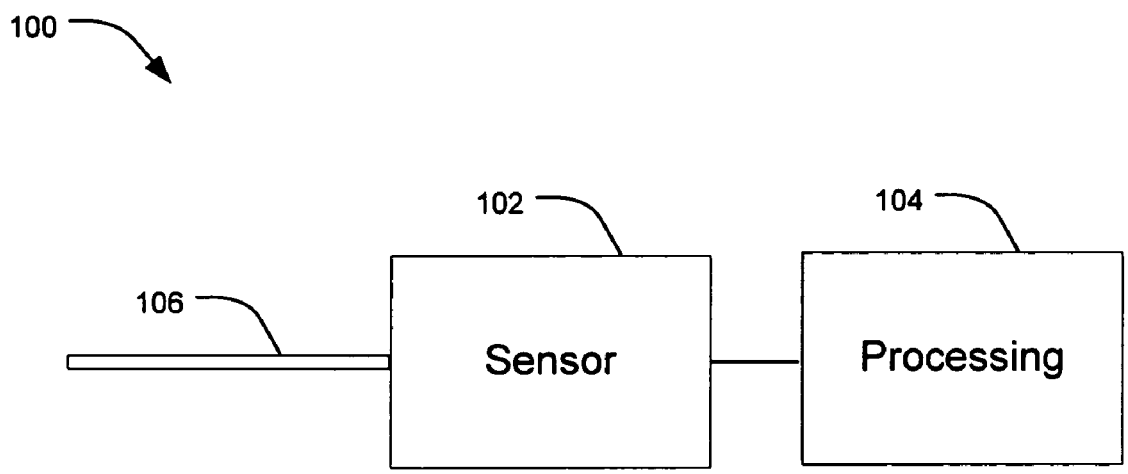
FIG. 1 is a block diagram of a system for detecting anomalies in a wire in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Before describing the presently preferred embodiment of the invention, it is useful to have some sort of context in order to understand how the various embodiments that are disclosed in this application are applicable to the rather narrowly focused title of the invention. The present invention includes several techniques for determining wire characteristics. The first broad technique utilizes what is referred to as impedance sensing. The second broad technique is referred to as a frequency domain sensing. The third broad technique is referred to as correlation sensing. These techniques include, but are not limited to, Spread Spectrum, Capacitance Measurements utilizing a timer circuit, RSSI, and Resonance, Correlation methods, Frequency Domain Reflectometry (FDR), Standing Wave Reflectometry (SWR), and Time Domain Reflectometry (TDR).

It is to be understood that, although this description is focussed on one particular exemplary application, the testing of a wire, various other applications of the inventive principles described herein are also possible some of which are discussed in further detail below. In general, distance measurement, length measurement, and impedance measurement may all be accomplished through the inventive techniques disclosed within. There are many applications to which these three characteristics can be applied. Distance measurements have important applications in manufacturing control of robotic vehicles, and in the monitoring of reservoirs of various materials such as water, fuel, food, etc. Likewise, length Measurements have already been shown to have important applications in the testing of aging wiring in various structures including planes, trains, automobiles, ships, all types of electrical machinery, etc. Finally, impedance measurements may also be used in the above mentioned applications and for the direct characterization of electrical systems, including wiring and antennas.

The terms "wire," "cable," "signal path" and "medium" are used interchangeably herein. Although "signal path" is used principally to refer to a wired signal path, it is to be understood that the disclosed inventive concepts may equally be applied to a wireless signal path. The terms "anomaly," "fault," "discontinuity," and "problem" are also used interchangeably herein.

It is an aspect of this invention that the techniques disclosed can be used on live wires. This can be particularly important in the transportation and military industries, for detection and localization of problems on an aircraft in flight.

Impedance Sensing

As illustrated in FIG. 1, a system, indicated generally at 100, in accordance with the present invention is shown for detecting anomalies in a wire. The system comprises a sensor 102 and processing 104 connected to the sensor to extract a desired wire characteristic from the measurement result of the sensor. The sensor may be interfaced to a wire 106 for which characteristics are to be measured. In this first embodiment, sensor 102 may be implemented using impedance-sensing, either in the form of capacitance- or inductance-sensing. Any conductor has a capacitance with respect to the ground or another conductor. The capacitance will depend on the area and physical shape of the conductors and the permittivity of the dielectric separating the conductors or the single conductor from ground. A long wire can be thought of as a series of these localized capacitors. Hence the bulk capacitance of the wire is directly related to its length. This property, combined with previous knowledge of the system under test, may be used to locate open-circuits. Similarly short-circuited wires behave like a series of inductance at low frequencies, and the bulk inductance is directly related to the length. Hence by measuring the capacitance in the case of open-circuited wires or inductance in the case of short-circuited wires, the location of an anomaly can be found.

Figure 2:
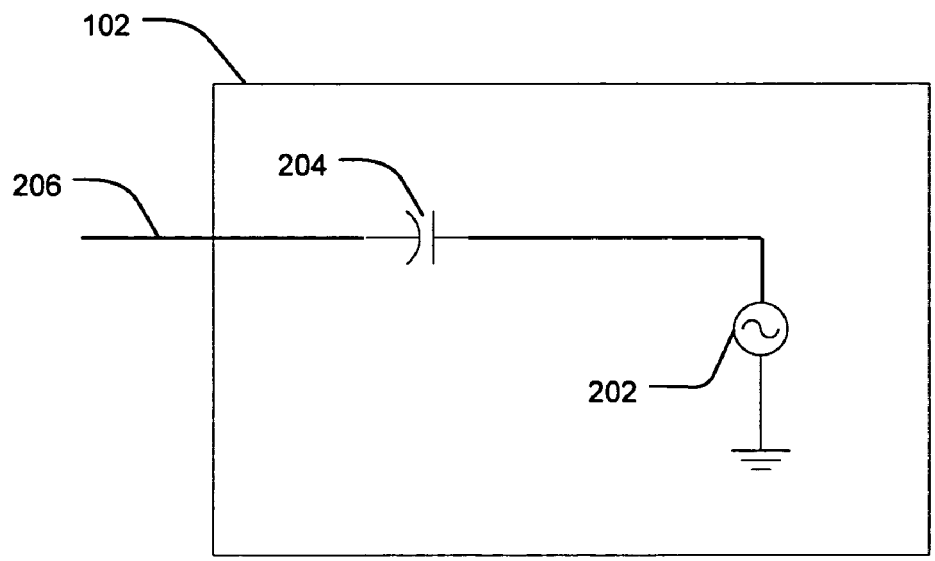
FIG. 2 is a block diagram of a sensor in accordance with an embodiment of the present invention.

FIG. 2 provides an illustration of one embodiment of a sensor 102 using capacitance-sensing techniques. The sensor 102 comprises a voltage source 202 and a reference capacitor 204. By attaching the sensor 102 to the wire at 206, the AC voltage produced by the voltage source 202 is divided between the reference capacitor 204 and wire 106 to produce a voltage $V_o$ at 206. The voltage $V_o$ may be compared to the voltage $V_{in}$ produced by the voltage source 202 to determine the capacitance of the wire, by solving the equation:

$$V_o = V_{in} * C_w / (C_w + C)$$

where $C_w$ is the capacitance of the wire 106 and C is the capacitance of the reference capacitor 204. Since the capacitance has a linear relationship to the length of the wire, the length can be determined from the capacitance. It experimental use, it was observed that the capacitance may vary in a nonlinear relation to the length of the wire, in which case a curve fit may be performed to yield more accurate results.

For example, for testing of 22-gauge paired speaker wire, it was found that a third order function enabled determination of the length of a wire within 17 cm accuracy for wire lengths of 0 to 700 cm.

Figure 3:
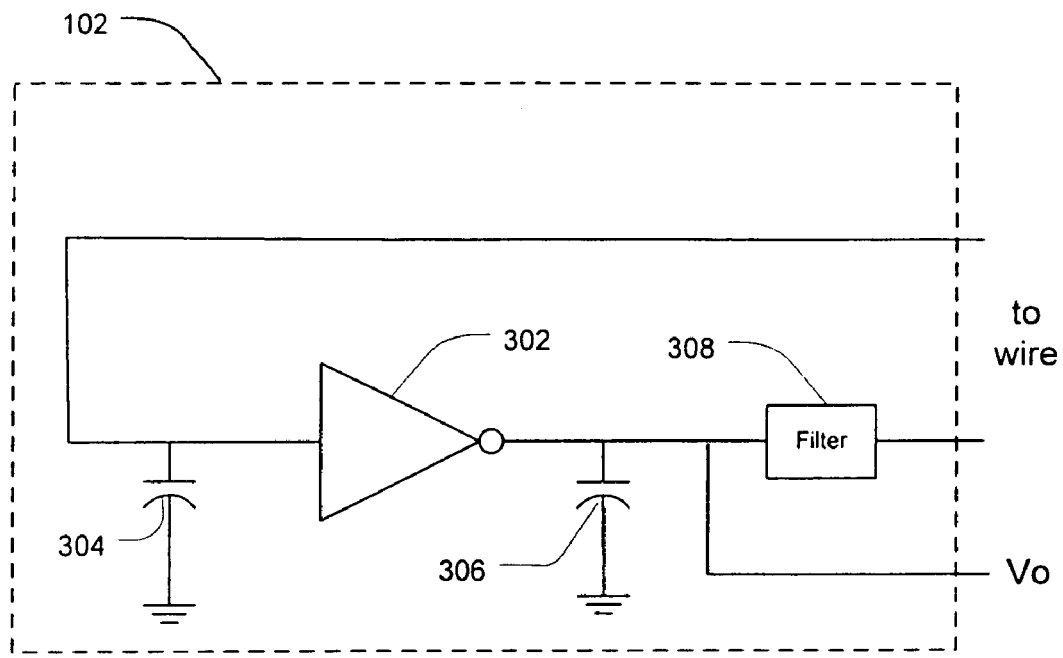
FIG. 3 is a block diagram of another sensor in accordance with an embodiment of the present invention.
Figure 4:
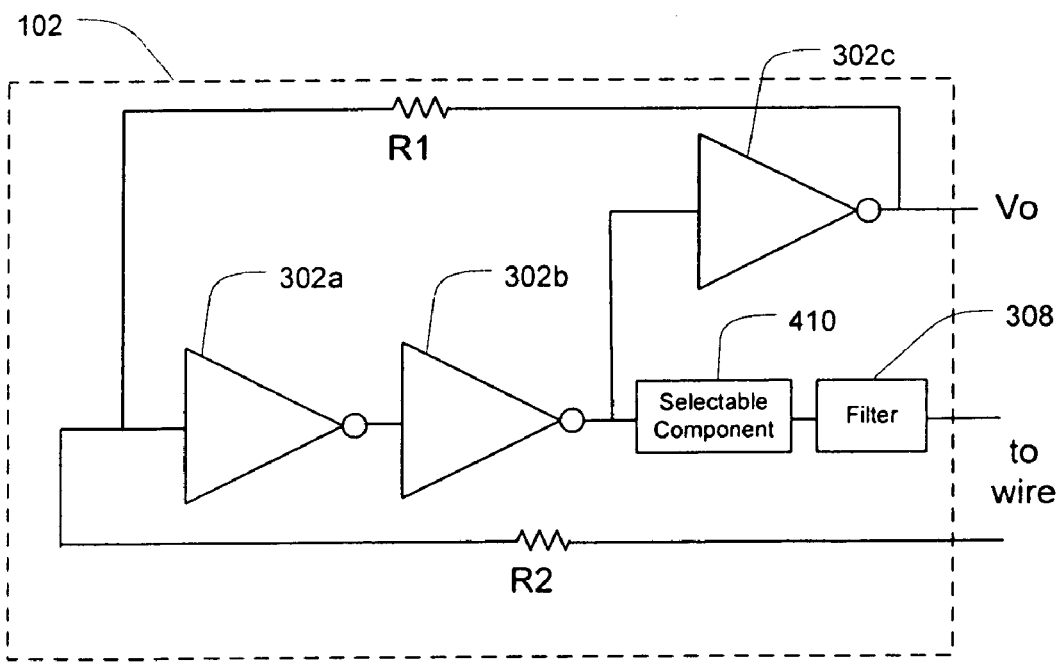
FIG. 4 is a block diagram of another sensor in accordance with an embodiment of the present invention.

FIGS. 3 and 4 provide illustrations of additional embodiments of a sensor 102 using impedance-sensing techniques. In FIG. 3 a sensor 102 is implemented using a digital inverter 302 and two capacitors 304 and 306. The inverter may be any type of digital logic inverter, such as a 7404 or similar device. The frequency output of the sensor in FIG. 3 and FIG. 4 is dependent on the propagation delay in the ring, introduced by the inverters 302 and the impedance of the wire 106. The propagation delay of such inverters is very small, on the order of a few nanoseconds, and hence the frequency output will be very high. Hence, the frequency is dependent on the location and type of the anomaly in the wire, and thus characteristics of the anomaly may be determined from the frequency.

For example, for the sensor of FIG. 3, the frequency is given approximately by:

$$F(Hz) = sqrt[(1/Lw)*(1/C2+1/C2)]/(2*\pi)$$

where Lw is the inductance due to the shorted wire.

By the use of the optional filter 308, live testing may be accomplished. By live testing is meant the ability to use the presently disclosed inventive techniques to perform testing of a wire within a system while the system remains operational during the testing. The filter 308 may be designed to separate test signals produced by the sensor from operational signals present on the wire being tested.

The sensor of FIG. 4 operates using similar principles to FIG. 3, using three inverters 302a, 302b, 302c. For example, the frequency output of the oscillator is given by:

$$F(Hz) = 1/[2*Cw*(0.405*Req+0.693*R1)]$$

where Req=R1*R2/(R1+R2) and Cw is the parallel capacitance of the wire.

A method for determining a distance to a open or short circuit anomaly may thus be performed by generating an alternating current signal, for example as described above. The alternating current signal may be applied to the wire, and the effects of the wire on the alternating current signal may be sensed. For example, the capacitance or inductance can be sensed directly using a capacitive or inductive voltage divider, or the capacitance or inductance can be sensed directly my measuring a change in the frequency of the alternating current signal. From an estimated capacitance or inductance determined from the sensed effect of the wire on the alternating current signal, the distance to the open or short circuit anomaly may be determined.

Optionally, a filter 308 may be inserted to enable live testing. Finally, an selectable component 410 may be configured as a short circuit for testing an open circuit wire 106, or as a capacitor for testing a open or short circuit wire 106. For example, when component 410 is selected to a capacitor of capacitance C, the frequency of oscillation is given approximately by:

$$F(Hz) = (Cw+C)/[2*C*Cw*(0.405*Req+0.693*R1)]$$

for an open circuit, and $$F(Hz) = 1/[\{2*C*(0.405*Req+0.693*R1)\} + (39.48*Lw*C)]$$

for a short circuit, where Req=R1*R2/(R1+R2), C is the reference capacitance, Cw is the capacitance due to the open wire, and Lw is the inductance due to the shorted wire. Both Cw and Lw are directly proportional to the length of the wire. The range of the sensor is dependent on C, an advantageous value of C was found to be 0.01 µF for testing of wires up to 500 cm long, although values of C in the range of 10 pF to 0.1 µF were found useful. The oscillation frequency is also dependent on the voltage of the power supply, hence the accuracy of the measurements are dependent on the degree to which the power supply is controlled.

Figure 5:
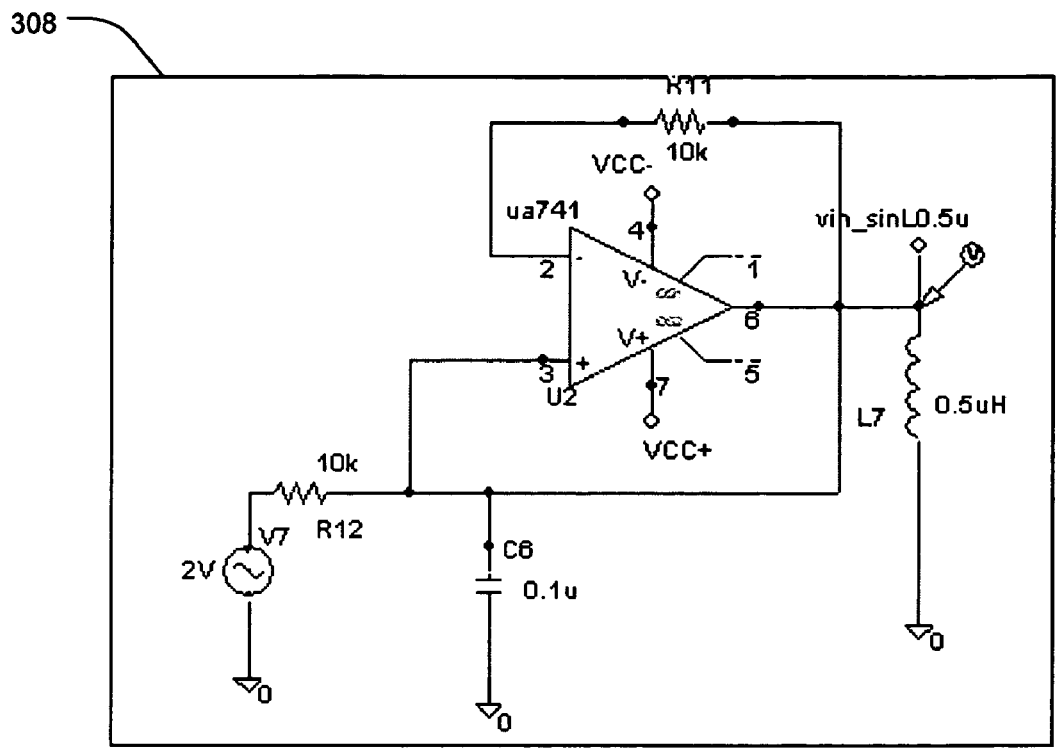
FIG. 5 is a circuit diagram of filter for use with the device of FIG. 3 in accordance with an embodiment of the present invention.

FIG. 5 illustrates an embodiment of filter 308. Many alternate arrangements of a filter will be known and obvious to one of ordinary skill in the art and to be considered within the scope of the presently described inventive concepts.

Figure 6:
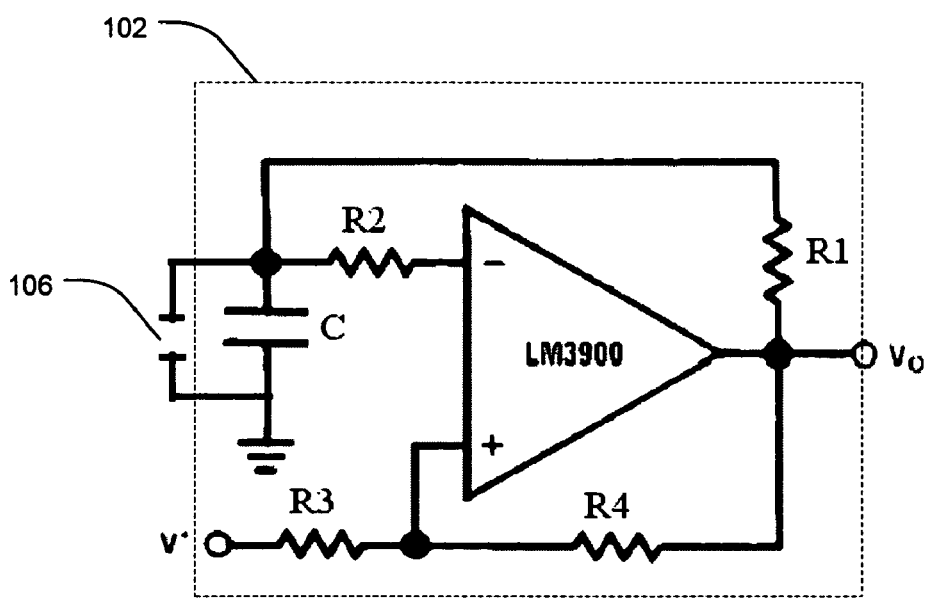
FIG. 6 is a block diagram of a sensor suitable for testing open circuited wires in accordance with an embodiment of the present invention.

FIG. 6 illustrates another embodiment of sensor 102 suitable for testing open circuited wires. The capacitor formed by the capacitor C and wire in parallel alternately charges and discharges through R1, between the voltage limits established by the resistors R2, R3 and R4. This combination produces a Schmitt Trigger circuit. When the output is low, the resistor R2 will cause the trigger to fire. When the current through this resistor equals the current which enters the non-inverting terminal through R3, the output goes high. The discharge through the capacitance will make the configuration oscillate.

The oscillation frequency of the voltage observed at $V_o$ is linear with the length of the wire, so the location of the open can be estimated. The generator was found to function well for R1=10 kΩ, R2=1 MΩ, R3=R4=10 MΩ and C=10 nF. Generally, the frequency is linearly proportional to the length of the wire, although improved accuracy may be obtained by performing a curve fit as discussed previously for other embodiments of the sensor.

Figure 7:
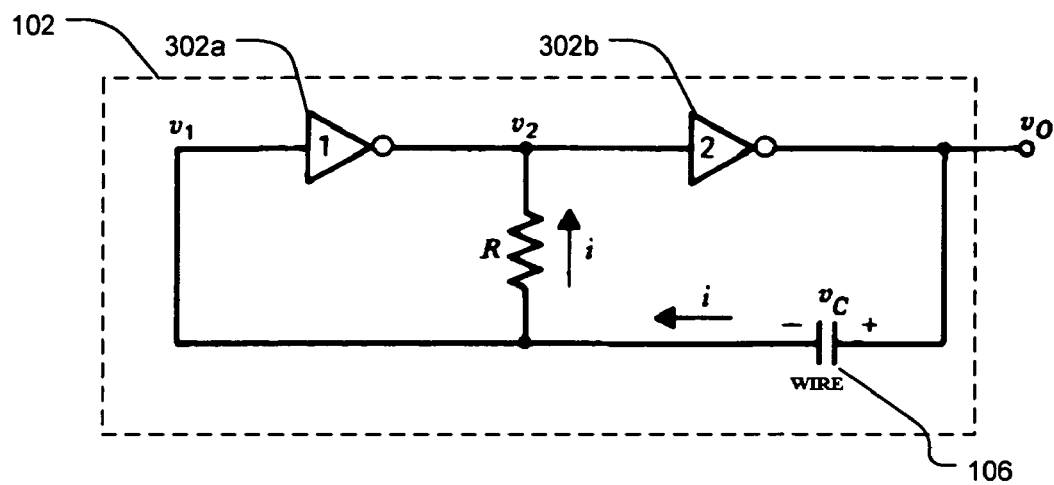
FIG. 7 is a block diagram of another sensor in accordance with an embodiment of the present invention.

FIG. 7 illustrates another embodiment of a sensor 102 operating on similar principles to those previously described suitable for detecting open circuit wires. The output of each inverter 302a, 302b is either logic 0 or logic 1, each corresponding to a fixed voltage. But the input v1 can vary slowly between certain limits because it is the voltage of the insulated gate, and also no current flows into the input. The only possible current path is between nodes v2 and v0. When v1 is logic 1, v2 and v0 will be logic 0 and logic 1 respectively. Then v1 is greater than the inverter switching voltage. The voltage across R produces a current i, which charges the capacitance of the wire 106, illustrated here as a capacitor, causing vc to rise. Thus v1 drops and when it is below the inverter switching voltage, the inverters switch states. The respective logic levels of v2 and v0 are now 1 and 0. The current i reverses and vc drops until v1 rises above the inverter switching voltage. Then the inverters again switch states. Hence the circuit functions as an oscillator.

The frequency output of this oscillator can be estimated using the expression:

$$F(Hz)=1/(5*Cw*R)$$

where, Cw is the parallel capacitance of the wire.

Operation of the circuit may be effected by connecting the "hot" wire lead in a feedback loop between one of the inverters and the resistor as shown. The wire that acts as the return path for current is connected between the resistor and the input of the other inverter as shown. The resultant frequency of the voltage observed at Vout is approximately linear with the length of the wire, so the location of the open can be estimated. As discussed above, when non-linear curve fits may be used to improve the accuracy of the sensor.

When a large value of resistance (R) is used, the voltage across it will be high, such that even a voltage corresponding to logic 0 on the oscillator might appear as a voltage corresponding to logic 1, hence preventing the circuit from behaving as an oscillator. The frequency also depends on the gate voltage Vcc. A desirable range of operation was obtained for R=1 KΩ and Vcc above 3.2 V, when inverter 302a, 302b was a 74LS04 integrated circuit.

Figure 8:
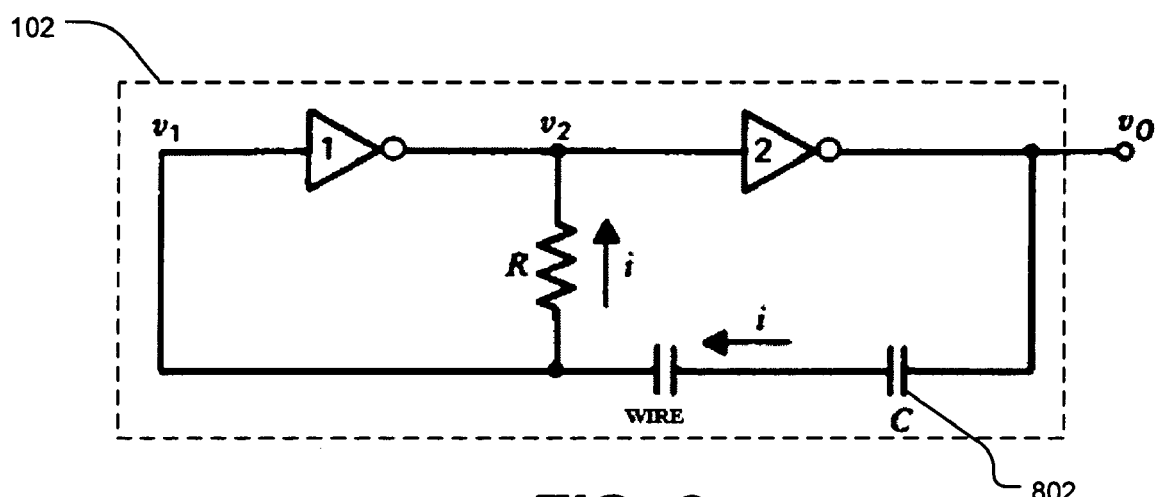
FIG. 8 is a block diagram of another sensor in accordance with an embodiment of the present invention.

FIG. 8 illustrates another embodiment of a sensor 102, slightly altered from FIG. 7 by the insertion capacitor 802. This sensor is suitable for use in locating short circuits in wires. The frequency output of this oscillator in the case of open or short circuited wires can be determined using the formula given below:

$$F(Hz)=(Cw+C)/(5*C*Cw*R)$$

for open circuits, and $$F(Hz)=(1+Lw*Cw)/(5*R*Cw)$$

for short circuits, where C is the reference capacitance, Cw is the capacitance due to the open wire, and Lw is the inductance due to the shorted wire. Both Cw and Lw are directly proportional to the length of the wire.

The capacitor 802 determines the range of the sensor. A desirable value for C was found to be 50 pF.

Figure 9:
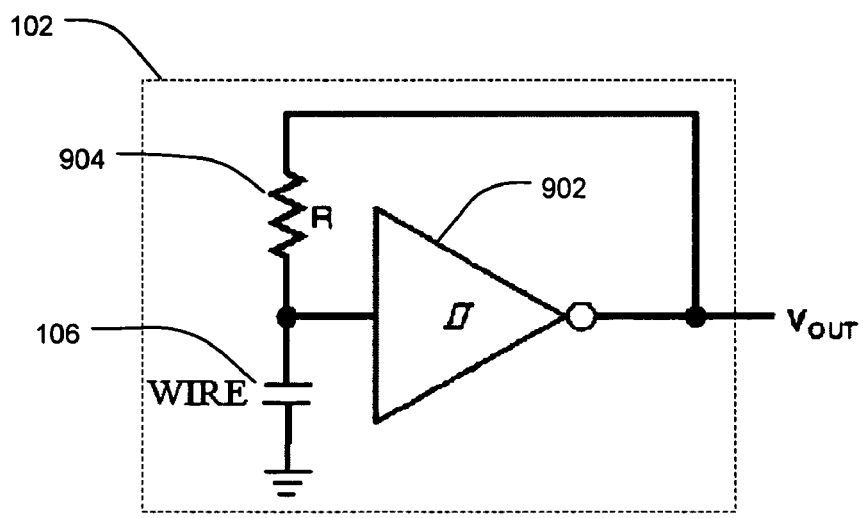
FIG. 9 is a block diagram of another sensor in accordance with an embodiment of the present invention

FIG. 9 illustrates another embodiment of a sensor 102 based on a Schmidt trigger 902. The output of the Schmidt trigger 902 is either +VSAT or −VSAT. When the output is at +VSAT the capacitance of the wire 106 will start charging. The voltage will increase until it crosses the reference voltage, at which point the output of the Schmitt trigger will change to −VSAT. Then the wire 106 starts to discharge until it falls below the reference voltage. Then the output of the Schmitt trigger 902 switches back to +VSAT. Hence the circuit functions as an oscillator. The frequency output of the oscillator is dependent on the resistor 904 and the capacitance of wire 106.

The frequency output of this oscillator can be estimated using the expression:

$$F(Hz)=0.8/(Cw*R)$$

where Cw is the parallel capacitance of the wire.

The resultant frequency of the voltage observed at Vout is approximately linear with the length of the wire, so the location of the open can be estimated. A resistor 904 value 1 kΩ and a Schmitt trigger 902 of 74LS14N type perform well.

Figure 10:
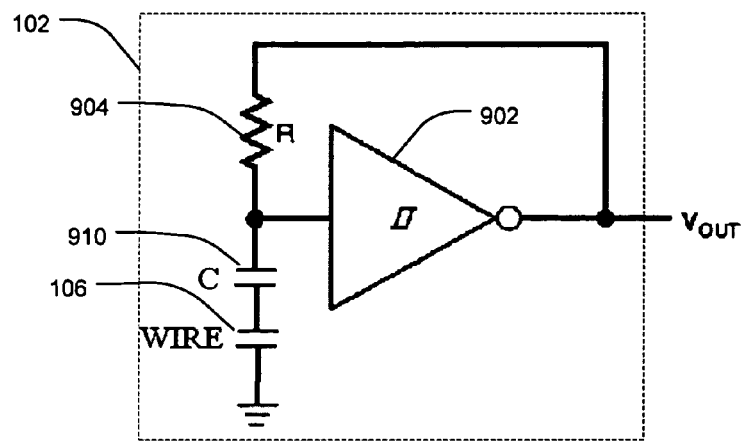
FIG. 10 is a block diagram of another in accordance with an embodiment of the present invention.

An another embodiment of a sensor 102 is illustrated in FIG. 10 wherein capacitor 910 has been added to adapt the sensor for location of short-circuits using similar principles as previously described. The frequency output of this oscillator in the case of open or short circuited wires can be determined using the formula given below:

$$F(Hz)=0.8*(Cw+C)/(C*Cw*R)$$

for an open circuit, and $$F(Hz)=0.8*(1+Lw*Cw)/(R*Cw)$$

for a short circuit, where C is the reference capacitance of capacitor 910, Cw is the capacitance due to the open wire 106, and Lw is the inductance due to the shorted wire 106. Both Cw and Lw are directly proportional to the length of the wire.

The range of the sensor is determined by the capacitance C of capacitor 910. A value of 0.1 μF was found to prove advantageous in measuring wires of lengths up to 270 cm.

Figure 11:
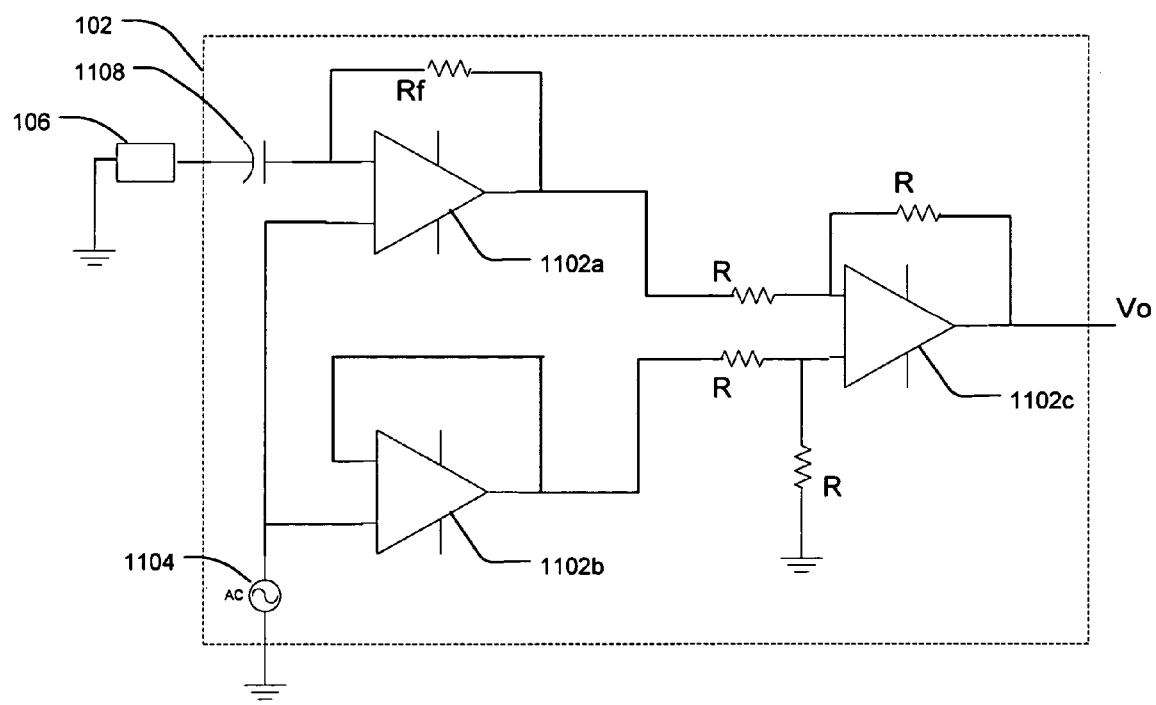
FIG. 11 is a block diagram of another sensor suitable for use with either short or open circuits in accordance with an embodiment of the present invention.

FIG. 11 illustrates another embodiment of a sensor 102 suitable for use with either short or open circuits. The sensor uses several operation amplifiers 1102 (op-amps), also known as a differential amplifier. When the non-inverting terminal of the op amp 1102a is fed with an input signal, the op amp 1102a acts as a non-inverting amplifier, with an amplification factor defined by the feedback resistor (Rf) and the impedance(Z) of the wire 106, connected to the inverting terminal. Op amp 1102b is used as unity gain voltage follower. A sine wave excitation signal is applied to both op amp 1102a and 1102b generated by signal source 1104. Op amp 1102c subtracts the signal generated by the sine wave source 1104 from the signal amplified by op amp 1102a. The resulting difference signal, Vo is quite sensitive to the impedance of the wire 106. The impedance of the wire 106 may be complex, in which case the output signal Vo is also complex, in which case both the amplitude and phase of Vo provide information related to the wire 106 impedance.

Capacitor 1108 is provided for testing when there is an short circuit. Capacitor 1180 may be omitted for testing of an open circuit wire 106. In such a case, the voltage output of the sensor 102 is given by:

$$Vo(V)=(Rf/Z)*Vin$$

Hence the unknown impedance can be estimated using the relationship, $$Z=(Vin/Vo)*Rf$$

In this relation, if Vo is complex, Z will also be complex and the reactive part (capacitance or inductance) may be found.

For short circuit testing, capacitor 1180 is included, and the output is given by either $$Vo(V)=(Vin*Rf*\omega*C*Cw)/(Cw+C)$$

for a short circuit, or $$Vo(V)=(Vin*Rf*\omega*C)/(1-\omega^2*Lw*C)$$

where Rf is the feedback resistance, C is the capacitance of capacitor 1108, ω is the frequency (in radians/sec) of the signal source 1104, and Cw is the capacitance of the wire 106, and Lw is the inductance of the wire. Both Cw and Lw are proportional to the length of the wire.

Figure 12:
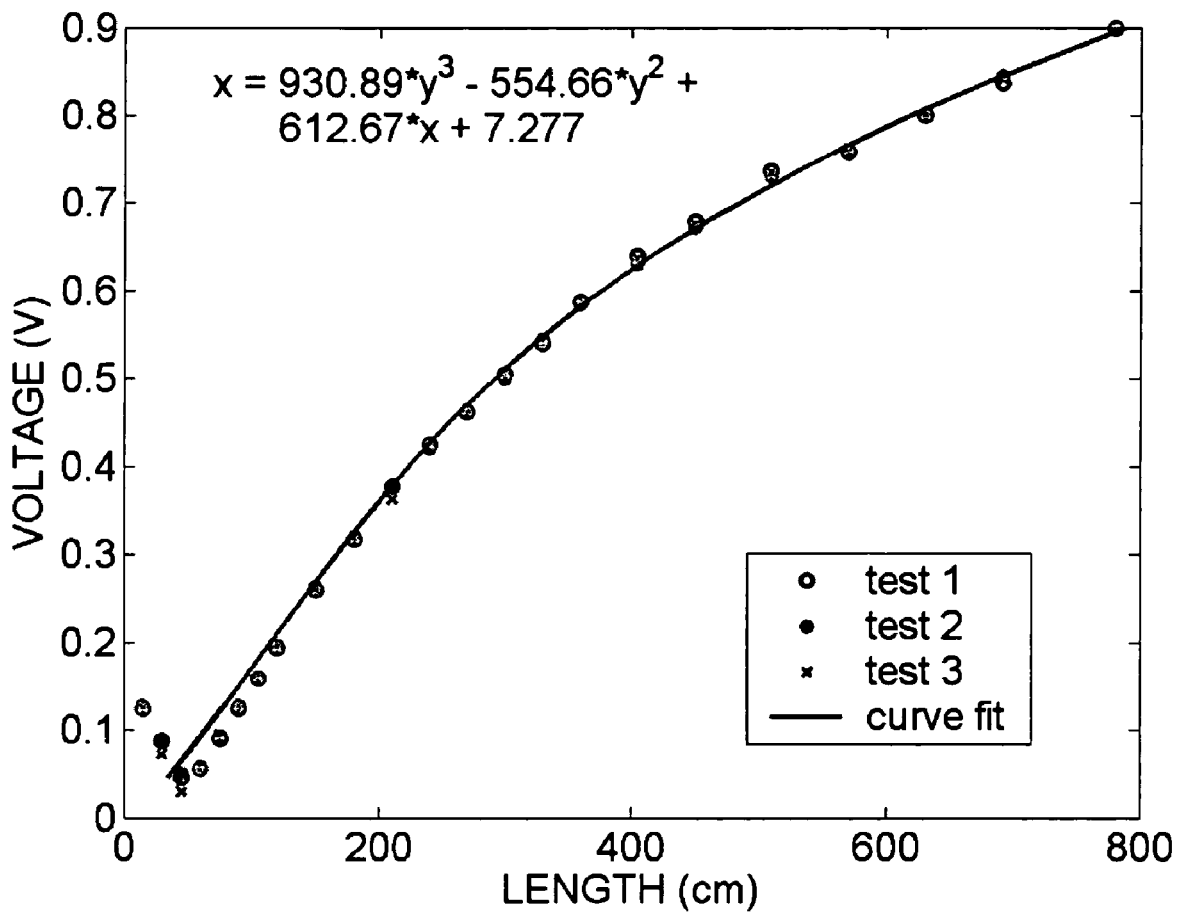
FIG. 12 is a graph of the performance of the sensor of FIG. 11 for an open circuit.
Figure 13:
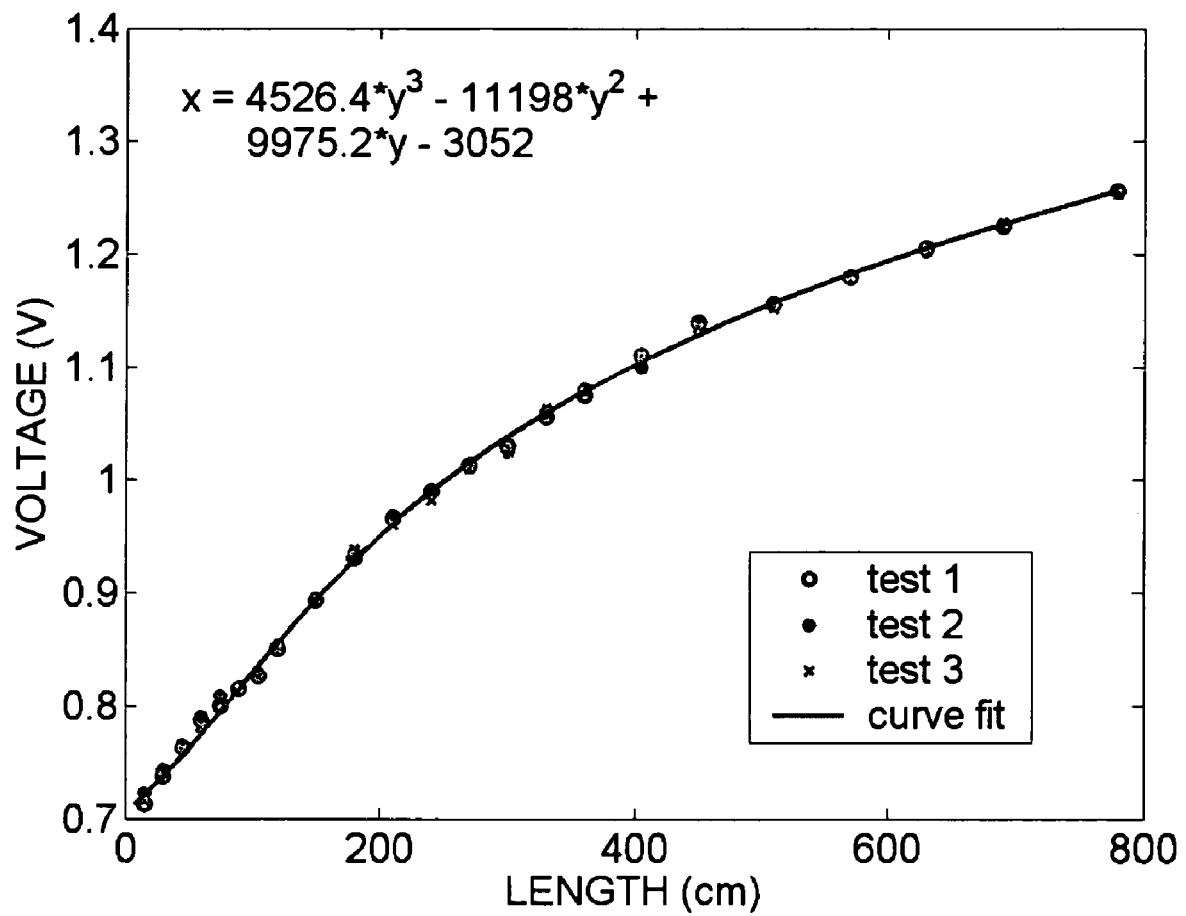
FIG. 13 is a graph of the performance of the sensor of FIG. 11 for a short circuit.

Performance of the sensor embodiment of FIG. 11 is excellent. Using a capacitance of 100 pF for capacitor 1108, and a signal source 1104 frequency, ω, of 60 kHz, provided accuracy of approximately 8 cm in determining the length of wires in length of up to 1000 cm. FIGS. 12 and 13 provide examples of the performance of the sensor of FIG. 11 for open and short circuited wire, respectively.

Figure 14:
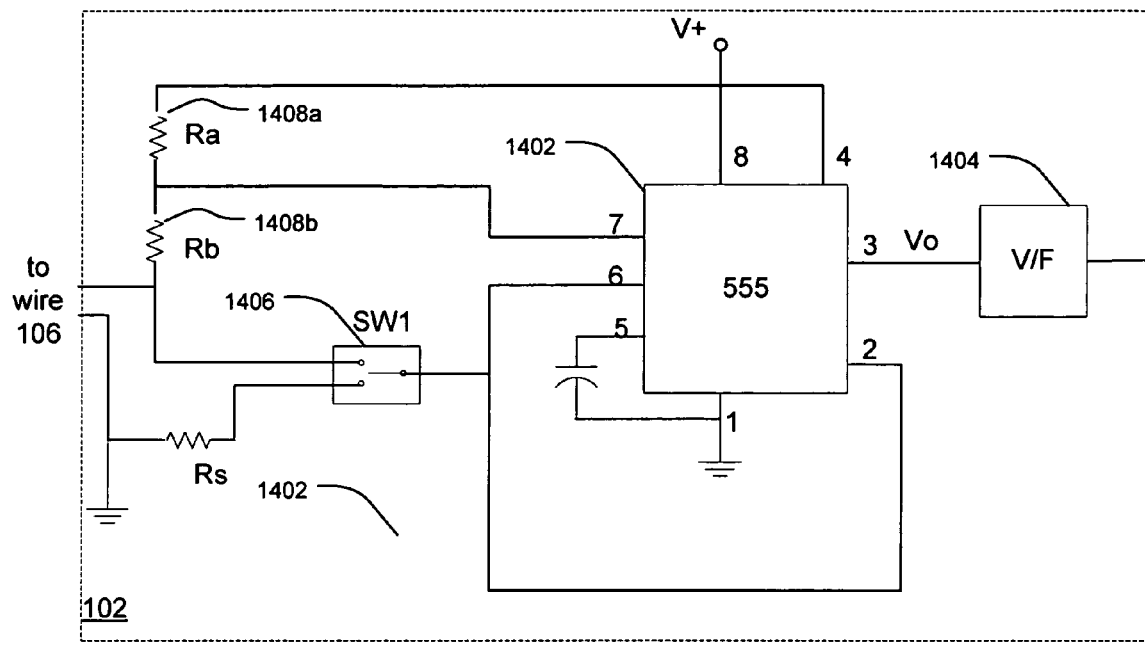
FIG. 14 is a circuit diagram of a sensor implemented using a 555 timer circuit.

FIG. 14 illustrates an embodiment of a sensor implemented using a 555 timer circuit suitable for use in measuring various characteristics of a wire, including open circuits, short circuits, partial short circuits, arcs, and moisture presense. While using a different 555 timer circuit is known for measuring the location of an open circuit on a wire, it is not known in the art how a timer circuit can be used to determine the location of a short circuit or measure other properties of a wire until the present invention.

A 555 timer chip 1402 generates a frequency of a digital signal as an output signal. The output signal is based on the length of the wire connected to the timer circuit. The output voltage Vo frequency is converted to a voltage through any convenient voltage converter means 1404.

It is an aspect of the present invention that it is possible to construct a timer circuit capable of open circuit and short circuit detection using the same timer chip by means of switch 1406. Another aspect of the invention is that the duty cycle may be controlled by the resistance of resistors 1408a, 1408b to select a particular duty cycle preferable for use with a particular frequency to voltage converter 1404.

The present invention is currently capable of detecting the location of an open circuit or a short circuit to at least 1000 inches. This should not be considered a limiting factor, and the distance will likely increase with more experimentation. What is interesting to note is that the performance results of FIG. 16 indicate that operation of the present invention is generally linear. Improved range of the sensor may be obtained by using calibration techniques as discussed above.

Figure 15:
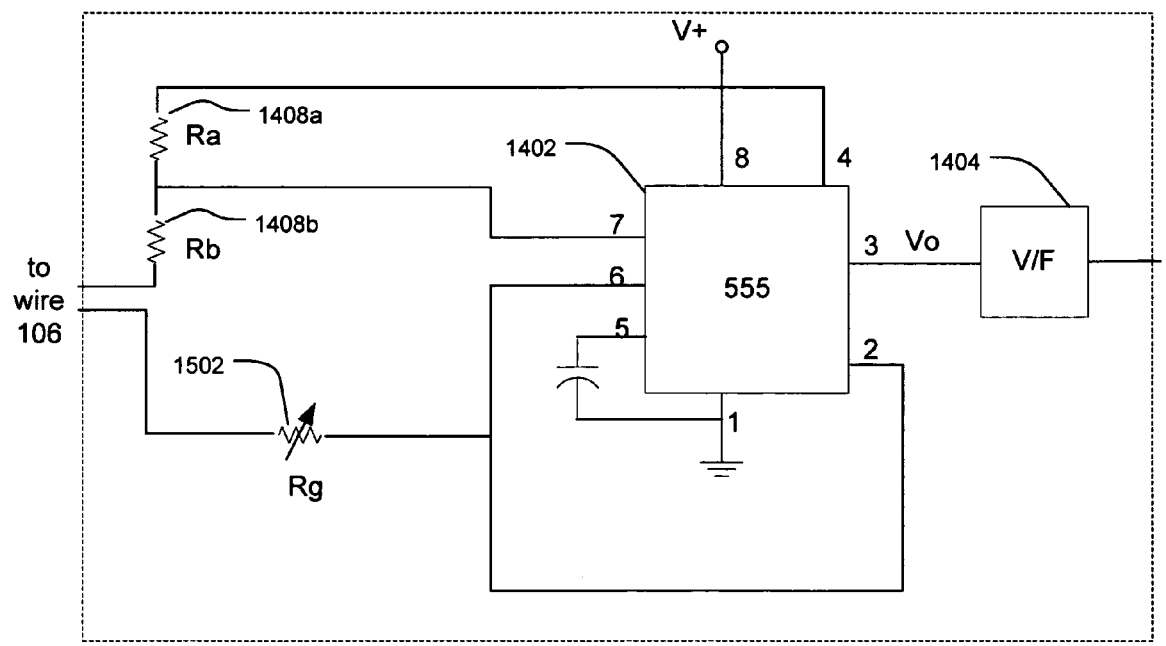
FIG. 15 is a circuit diagram of an alternate configuration of the sensor in FIG. 14.

FIG. 15 illustrates an alternate configuration of an embodiment of a sensor 102 similar to that shown in FIG. 14. The switch 1406 (FIG. 14) has been eliminated and a variable resistor 1502 inserted. This circuit may prove more stable in operation than that illustrated in FIG. 14. The variable resistor 1502 may be varied over a range of about 0 to 10 M ohms, allowing measurement of both open and short circuited wires 106.

With respect to both FIG. 14 and FIG. 15, the pinout functions of the 555 timer chip 1402 are given as below in TABLE 1.

TABLE 1

555 Timer Chip Pinouts

| Pin | Function |
|---|---|
| 1 | Ground |
| 2 | Trigger |
| 3 | Output |
| 4 | Reset |
| 5 | Control |
| 6 | Threshold |
| 7 | Discharge |
| 8 | Vcc |

Figure 16:
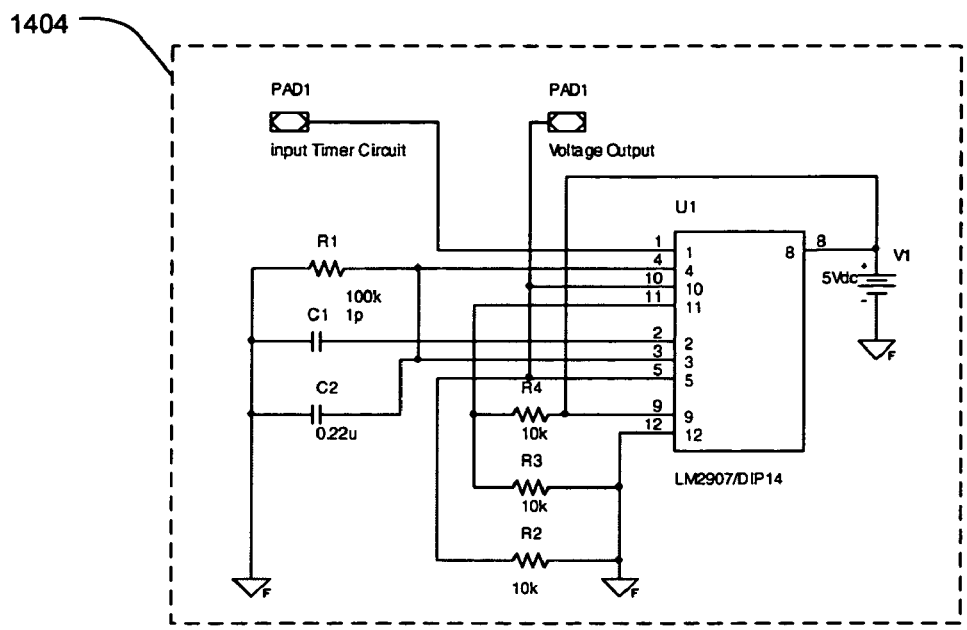
FIG. 16 is a circuit diagram of a frequency to voltage converter for use with the sensor of FIGS. 14 and 15.
Figure 17:
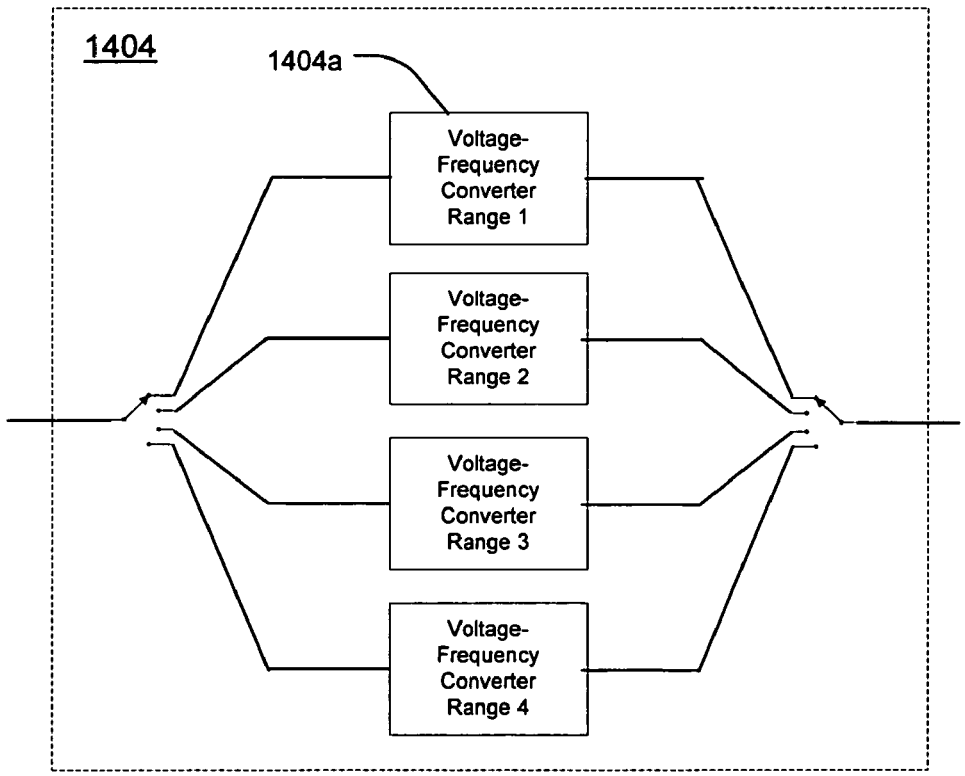
FIG. 17 is a block diagram of a multiple range frequency to voltage converter for use with the sensor of FIGS. 14 and 15.

An embodiment of a frequency to voltage converter 1404 is illustrated in FIG. 16. Many other frequency to voltage converters will be known to one of ordinary skill in the art and are to be considered within the scope of the present invention. It is important to note that a frequency to voltage converter is often limited in operating range, providing good performance over a limited range of frequencies. To provide a greater range of operation for the sensor 102, multiple frequency to voltage converters 1404a may be used to cover different frequency ranges corresponding to different wire lengths as illustrated in FIG. 17. For example, two frequency to voltage converters 1404 could be provided covering ranges of, for example, 0-7.7 kHz and 0-1.5 kHz. The wider range may provide for measuring a wider range of wire lengths, while the narrow range may provide for measuring a narrower range of wire lengths but with greater accuracy. The range of the frequency to voltage converter need not be limited at one end to 0 Hz. The frequency to voltage converter might cover a narrow range of frequencies, providing high accuracy for a particular wire length. Various other combinations of multiple frequency to voltage converters will occur to one skilled in the art.

It is important to note that the electrical properties of a wire depend on the construction of the wire. Hence, determination of the length of the wire from the measured electrical properties requires knowledge of the electrical properties of the wire. This knowledge may be obtained in a variety of ways, including measuring samples of the wire and generating calibration data as described above, and using published capacitance and inductance data for a particular wire type.

Figure 18:
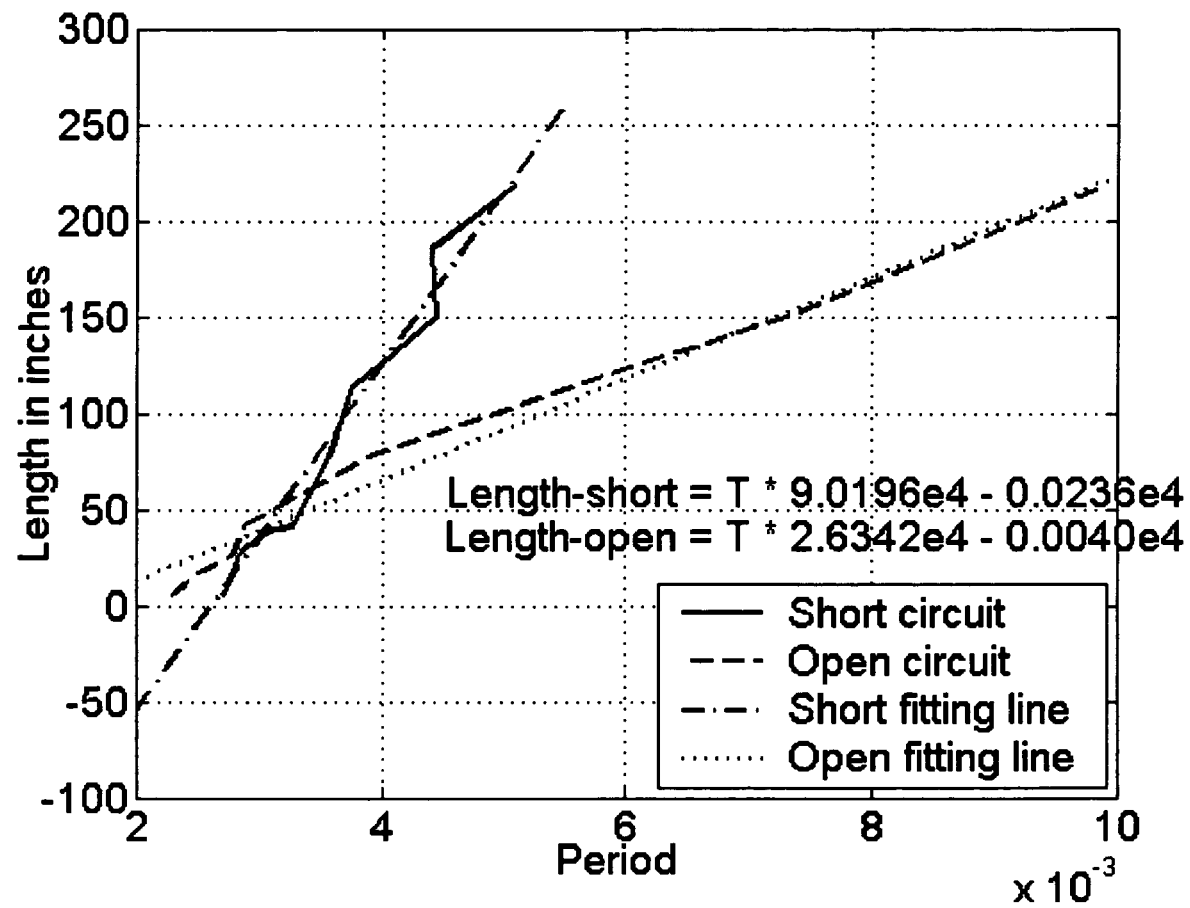
FIG. 18 is a graph of performance results for the sensor embodiment of FIG. 14.

FIG. 18 illustrates performance results for the sensor embodiment of FIG. 14.

In another aspect of the present inventive techniques, the capacitance-sensing techniques may also be used to measure the height of materials or fluids, moisture content of material, fluid type, and depth.

Figure 19:
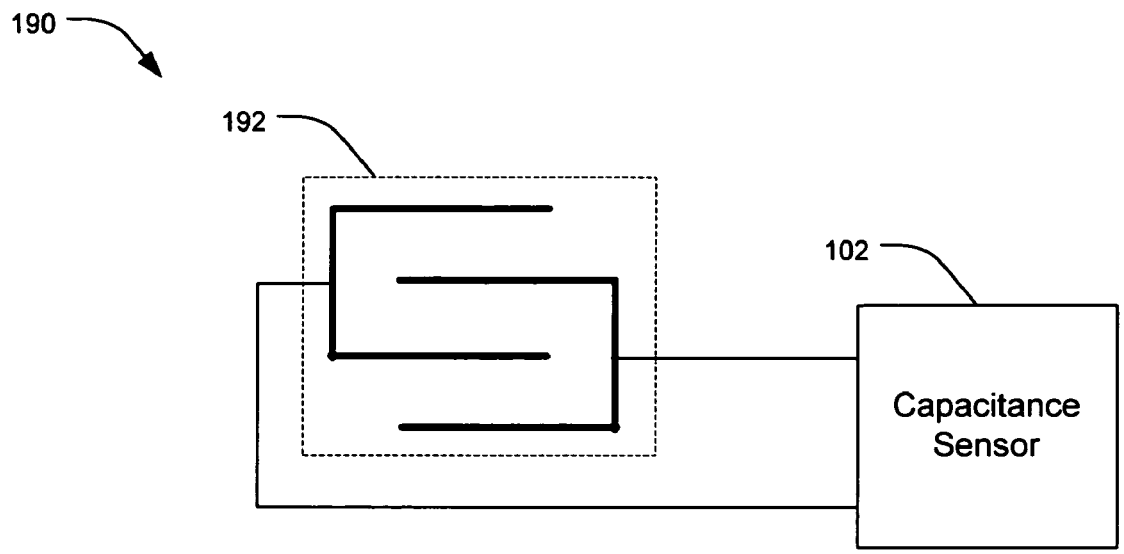
FIG. 19 is a block diagram a sensing system in accordance with another embodiment of the present invention.

FIG. 19 illustrates a sensing system in accordance with another embodiment of the present invention. A set of multiple parallel plates 192 provides a capacitance that is variable depending on the material characteristics between or in proximity to the parallel plates 192. Different materials have different dielectric constants, and hence the capacitance will be different depending on the material. Calibration of the sensing system 190 for different materials may be accomplished. For example, the sensing system may be calibrated to detect the difference between two or more different types of gas, or the sensing system may be configured to detect the density or moisture content of a gas, fluid, or loose material.

Figure 20:
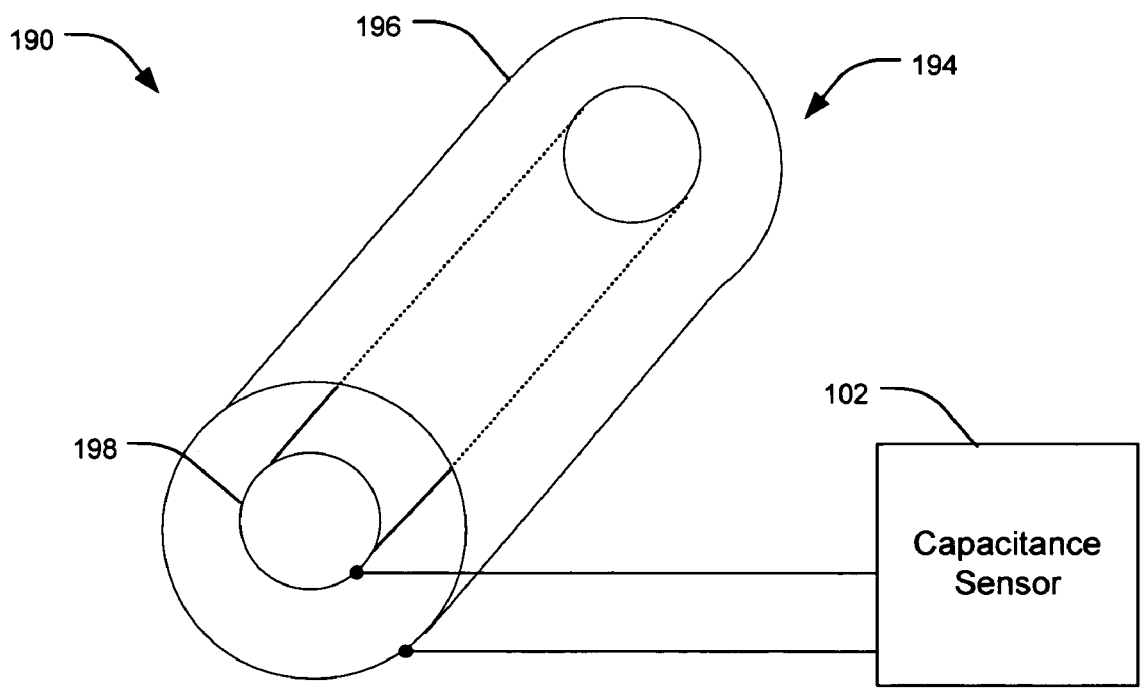
FIG. 20 is a block diagram of an alternate embodiment for the sensing system of FIG. 19.

FIG. 20 illustrates an alternate embodiment for the sensing system 190. A concentric cylinder 194 includes an outer cylinder 196 and an inner cylinder 198. Operation uses similar principles as discussed above. In general, the capacitance will be a function of the surface area of the plates or cylinder, S, the spacing between the plates, d, and the dielectric constant of the material, ε. The capacitance is approximately:

$$C = k\epsilon S/d$$

where k is a constant which can be calibrated out.

Frequency Domain Sensing

Figure 21:
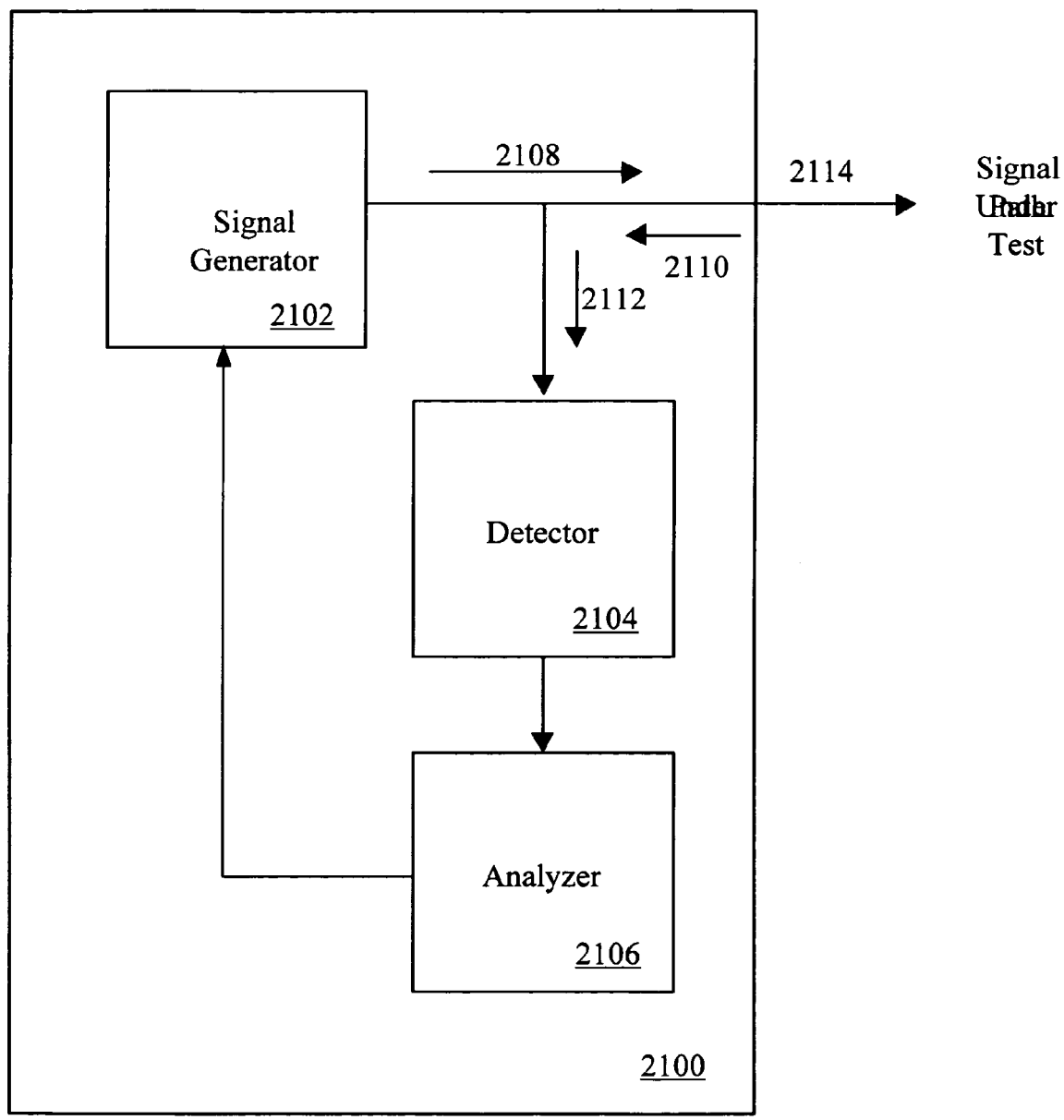
FIG. 21 is a block diagram of a Mixed Signal Reflectometer in accordance with an embodiment of the present invention.

FIG. 21 illustrates a block diagram of a Mixed Signal Reflectometer (MSR) 2100 in accordance with an embodiment of the present invention using frequency domain sensing techniques to test a signal path under test 2114. The signal path under test 2114 may be a wire, multi-conductor cable, twisted pair, shielded cable, coaxial cable, printed circuit board trace, antenna, or virtually any conductor of electricity.

The MSR 2100 may include a signal generator 2102 for generating a test signal 2108 which is injected into the signal path under test 2114. The MSR 2100 may further include a detector 2104 in communication with an analyzer 2106 for receiving a reflected signal 2110.

The test signal 2108 is reflected by the signal path under test 2114 to produce a reflected signal 110. Because the test signal 2108 and reflected signal 2110 are not separated from each other in time, like in the conventional time domain reflectometry (TDR), or physically separated, as in directional couplers used in the conventional frequency domain reflectometry (FDR), the reflected signal 2110 is superimposed upon the test signal 2108, producing a superimposed signal 2112. As will shortly be described, the present invention avoids the need to separate these signals as is done by conventional TDR and FDR, eliminating the need for bulky directional couplers of FDR and highly precise timing of TDR.

Depending on the nature of the anomaly in the signal path under test 2114, this superimposed signal 2112 will demonstrate unique characteristics in phase and amplitude as a function of the frequency of the test signal. Superimposed signal 2112 is processed by the detector 2104 to convert these unique phase and amplitude characteristics into a low frequency signal that can be analyzed the by analyzer 2106 without requiring highly precise timing. Because the phase information is preserved and converted by detector 2104, the MSR 2100 enables accurate location of anomalies in the signal path. This is not the case with the conventional standing wave reflectometry that discards phase information and operates on amplitude information only. Analyzer 2106 uses the phase and amplitude information from the detector 2104 to determine the location of anomalies in the signal path under test 2114.

Figure 22:
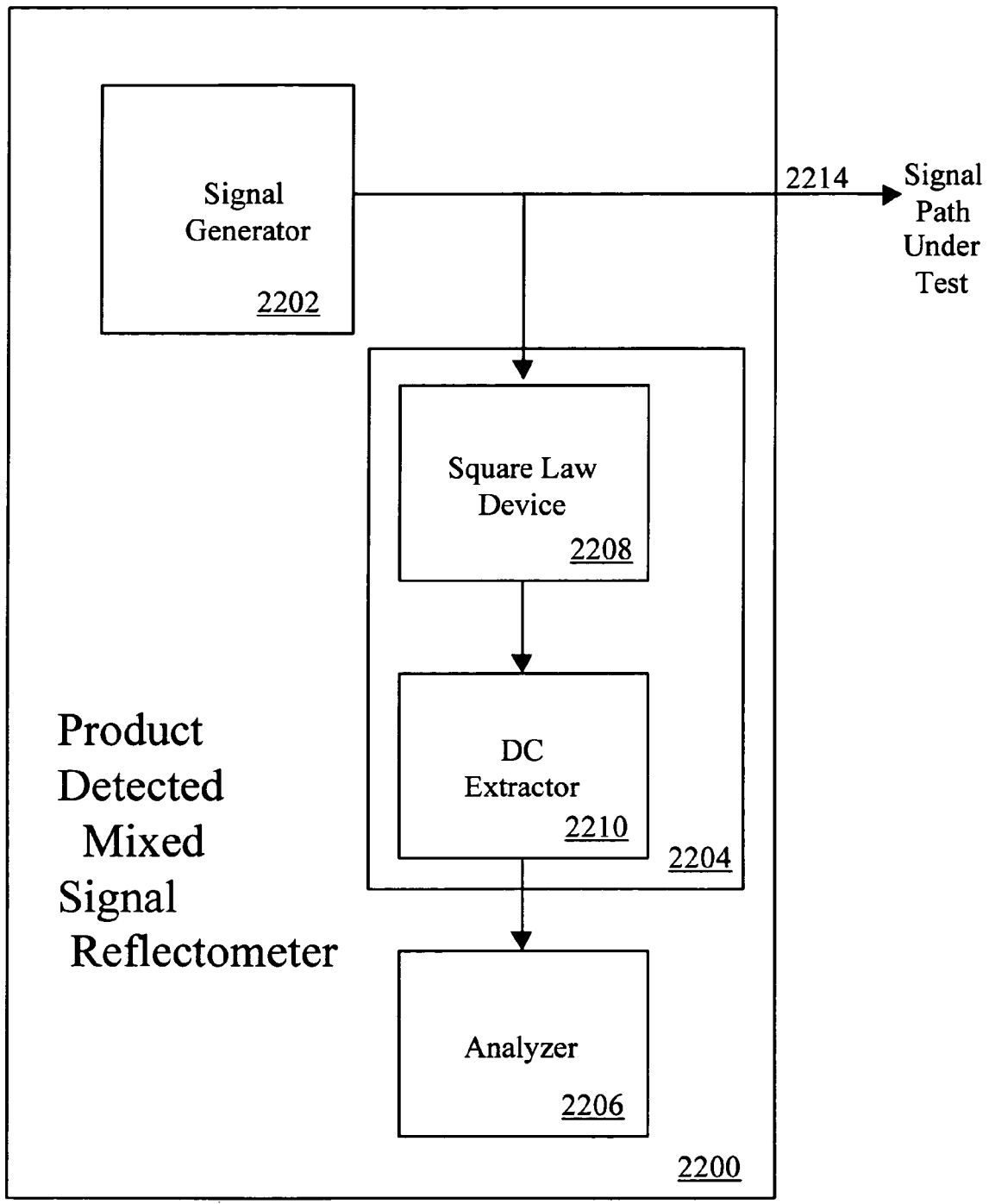
FIG. 22 is a block diagram of a Product-Detected Mixed Reflectometer in accordance with another embodiment of the present invention.

FIG. 22 illustrates an embodiment of the present invention in the form of a Product Detected Mixed Signal Reflectometer (PDMSR) 2200. In a PDMSR 2200, a test signal may be generated by a sine wave signal generator 2202 for injection into the signal path under test 2214. Additionally, detector 2204 may include a square law device 2208 in communication with a direct current (DC) extractor 2210. In PDMSR 2200, the output signal from the signal generator 2202 is given by:

$$\sin(\omega t),$$

where $\omega$ is the frequency of the test signal.

Assuming, for illustration purposes, the signal path under test 2114 has an anomaly that results in a reflected signal of the form:

$$\beta \sin(\omega t + \theta)$$

where $\theta = \omega \tau$ and where $\tau$ indicates the distance to the anomaly. The superimposed signals would thus combine to form:

$$\sin(\omega t) + \beta(\sin(\omega t + \theta))$$

which is the input to the detector 2204.

More specifically, the superimposed signal is input to the square law device 2208. The square law device 2208 is configured to perform the operation of squaring the superimposed signal to yield:

$$[\sin(\omega t) + \beta(\sin(\omega t + \theta))]^2$$

which can be rewritten as:

$$0.5 + 0.5\beta^2 + 2\beta \cos(\theta) - 2 \cos(2\omega t) - 0.5\beta^2 \cos(2\omega t + 2\theta) - 2\beta \cos(2\omega t + \theta).$$

Square law device 2208 may be implemented in a variety of forms, for example and not by way of limitation, a mixer, an integrator, an operational-amplifier, or generally any device providing a squaring function or a non-linear function yielding a squaring operation.

Output from the square law device 2208 is then provided to the DC extractor 2210, which extracts the low frequency component, to yield:

$$0.5 + 0.5\beta^2 + 2\beta \cos(\theta)$$

at the output of the detector 210.

It should be noted that the DC extractor 2210 function may be realized by implementing the analyzer 2206 with a limited frequency response. For example, an analyzer 2206 implemented by means of an analog to digital converter and subsequent digital signal processing (not shown) will automatically extract the low frequency component due to the limited response of the analog to digital converter.

Analyzer 2206 may determine the distance to the anomaly by examining the variation of the detector output as a function of the test signal frequency $\omega$. For example, the detector output will vary from a maximum, where $$\theta 1 = \omega 1 \tau = 2k\pi$$

to a minimum, where $$\theta 2 = \omega 2 \tau = 2(k+1)\pi$$

where k is a positive integer. As $\omega$ is varied over a range, the detector output will periodically vary between a minimum and maximum. Hence, the distance to the anomaly, $\tau$ may be determined by varying 2 and finding the distance between these extrema (minimums or maximums), where $$\tau = \pi/(\omega 2 - \omega 1).$$

Note that this distance is expressed in terms of a time delay. It frequently will be preferable to display this distance as a length measurement by taking into account the propagation velocity in the signal path under test. In the preferred embodiment, the MSR automatically determines the propagation velocity from the magnitude and phase of the reflected signal that is returned from the beginning of the signal path under test (corresponding to a distance of $\tau = 0$).

Alternately, a fixed average propagation velocity could be assumed by the MSR (resulting in reduced accuracy), or the MSR user could provide input to the MSR of the velocity propagation.

In the event that the distance to the anomaly, $\tau$ is very small, it may be possible that the extrema are very far apart, in which case it is impractical to search for the minimum and maximum. In this case, analyzer 2206 may be implemented by performing pattern matching against the expected DC extractor output by injecting several different test values of $\omega$ and performing a best fit estimate to determine $\beta$ and $\tau$.

Consequently, the signal generator 2202 may take, for example and not by way of limitation, the form of a swept frequency sine wave, a multi-frequency sine wave, a stepped-frequency sine wave, or even an arbitrary signal, depending on the nature of the signal path anomaly to be detected.

Note that the signal generator may be implemented with a voltage controlled oscillator (VCO) or may use multiple VCOs to that cover different ranges. For example, by using a lower frequency VCO, longer lengths may be detected, yes by using a high frequency VCO smaller anomalies in the wire may be detected. Thus, by combining both a low and high frequency VCO, precise location of small anomalies may be obtained while avoiding ambiguity problems caused by "wrap around" of the signal phase. By "wrap around" is meant phase rotations of greater than 360 degrees which occur for a wire of length greater than one half the wavelength of the frequency generated by the VCO.

Where multiple anomalies exist in the signal path under test 2214, multiple reflected signals may be superimposed on the test signal. This will result in a more complex superimposed signal, with extrema appearing at multiple different periodicity corresponding to the different distances to the multiple anomalies. These multiple distances may be sorted out by a variety of techniques, including the use of a Fast Fourier Transform (FFT) or techniques used to separate the line spectrum of chemical elements.

Figure 23:
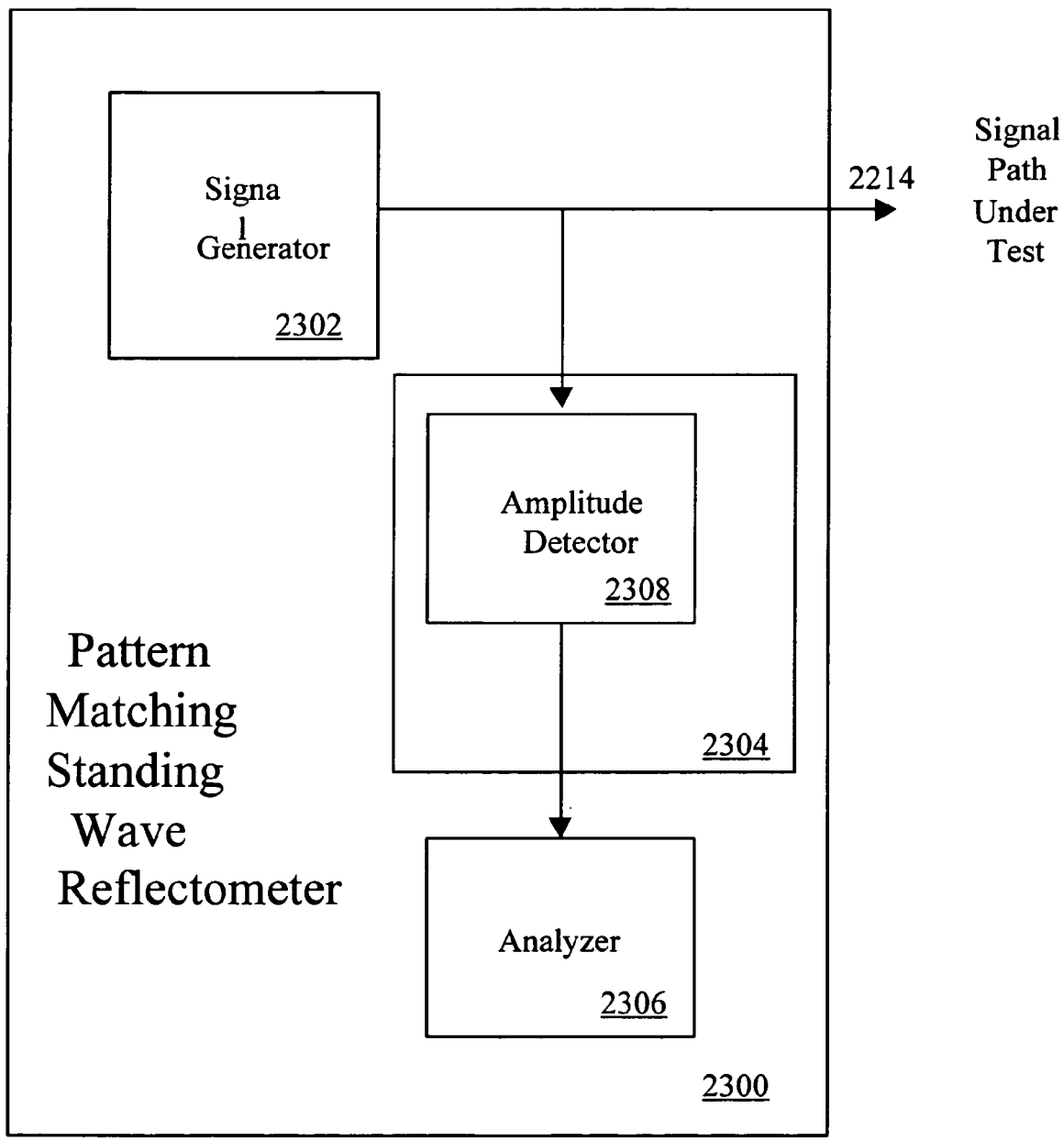
FIG. 23 is a block diagram of a Pattern Matching Standing Wave Reflectometer in accordance with another embodiment of the present invention.

FIG. 23 illustrates yet another embodiment of the present invention in the form of a Pattern Matching Standing Wave Reflectometer (PMSWR) 2300. In a PMSWR 2300, detector 2304 may be implemented as an amplitude detector 2308. The injection of a test signal from signal generator 2302 and resulting superposition of the reflected signal on the test signal is as described for the MSR 2100 above. The resulting superimposed signal presented to detector 2304 is of the form, $$\sin(\omega t) + \beta(\sin(\omega t + \theta)).$$

Detector 2304 may include amplitude detection 2308, which yields an output:

$$sqrt[0.5 + 0.5\beta 2 + 2\beta \cos(\theta)],$$

which is fed to analyzer 2306.

Analyzer 2306 may be configured to perform a pattern matching operation as discussed previously for the analyzer 2206 of PDSWR 2200.

Figure 24:
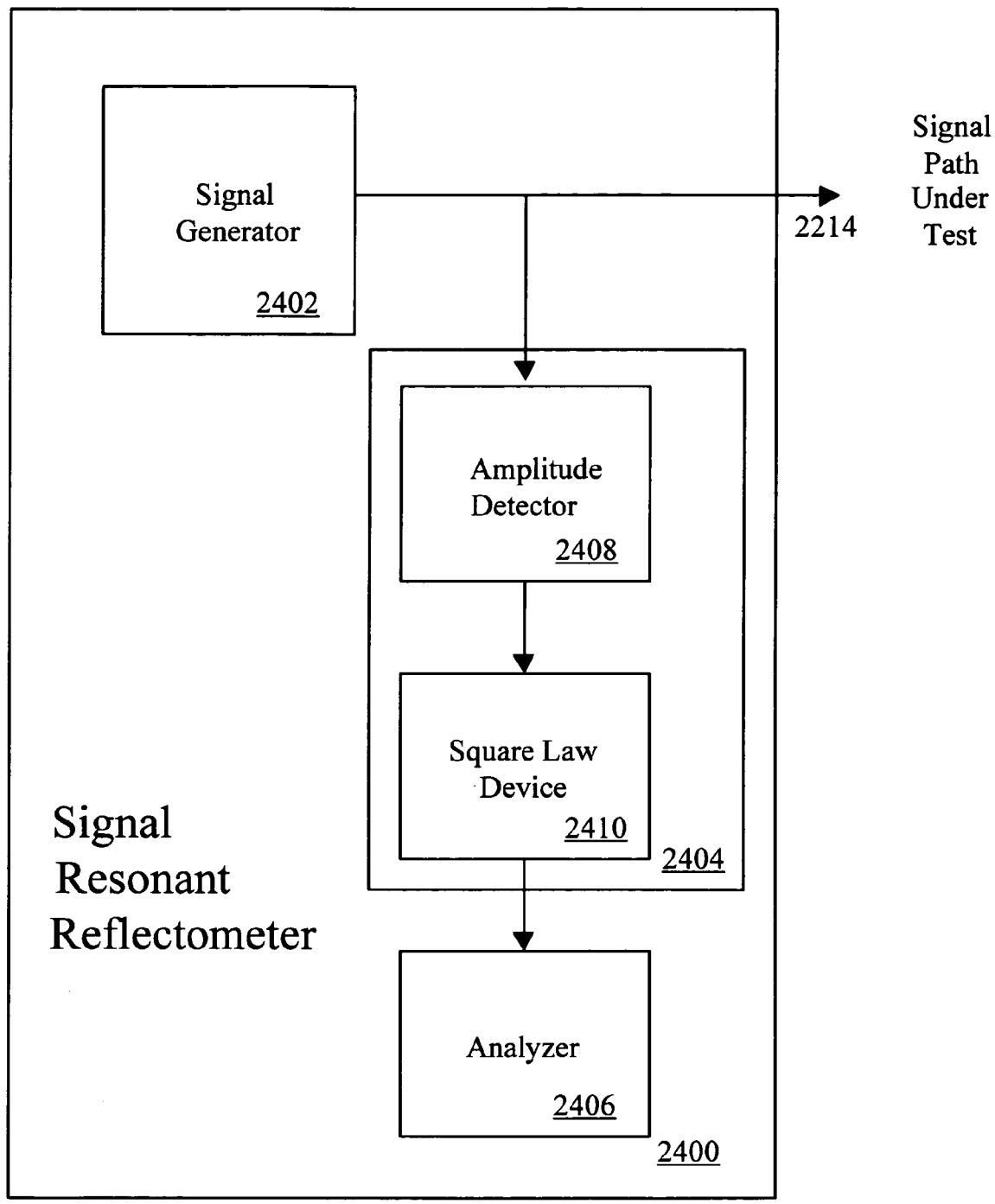
FIG. 24 is a block diagram view of a Signal Resonant Reflectometer in accordance with another embodiment of the present invention.

FIG. 24 illustrates still another embodiment of the present invention in the form of a Signal Resonant Reflectometer Type I (SRR-I) 2400. Signal generator 2402 may inject a test signal as previously described for MSR 2100, PDMSR 2200 and PMSWR 2300, resulting in a reflected signal superimposed on the test signal being fed to detector 2404. Detector 2404 may be implemented by an amplitude detector 2408 followed by a square law device 2410, yielding output to analyzer 2406 of the form, $$0.5 + 0.5\beta 2 + 2\beta \cos(\theta).$$

Analyzer 406 may operate similarly as disclosed above for analyzers 2106, 2206 and 2306.

An SRR-I 2400 may also be configured to use a phase detector in place of amplitude detector 2408, resulting in a Signal Resonant Reflectometer Type II (SRR-II).

Figure 25:
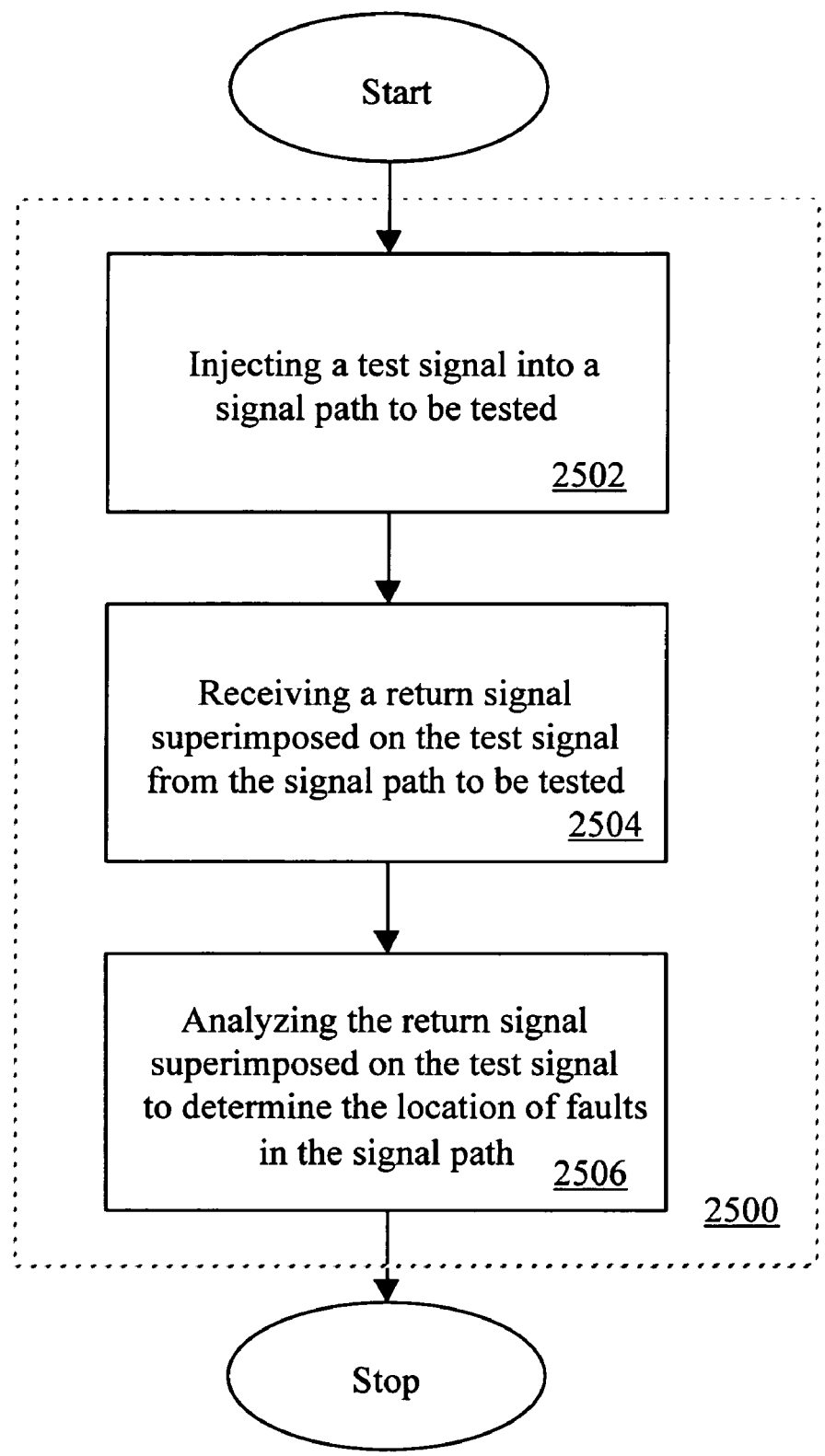
FIG. 25 is flow chart of a Mixed Signal Reflectometer in accordance with an embodiment of the present invention.
Figure 26:
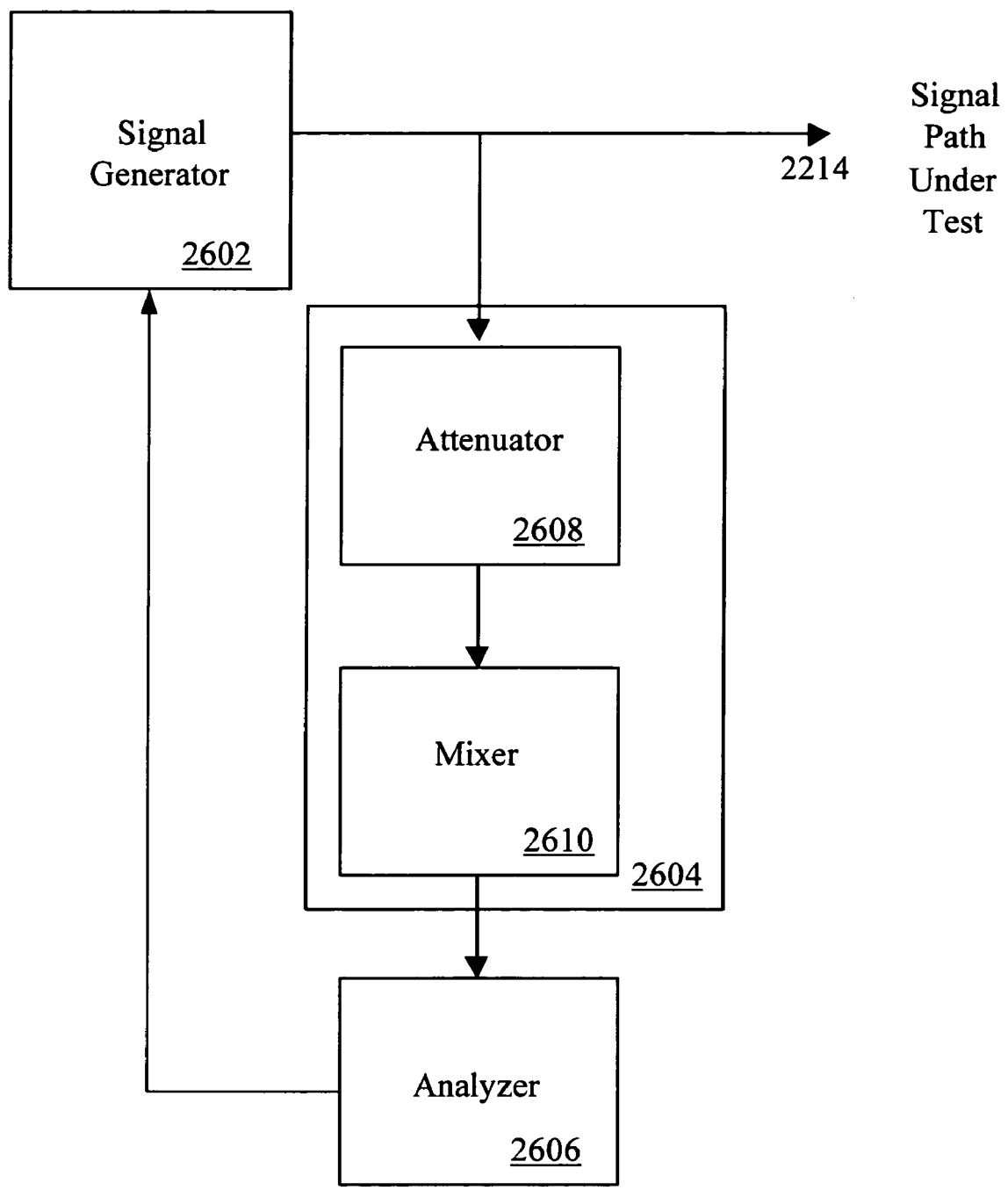
FIG. 26 is a block diagram of a mixed signal reflectometer in accordance with an embodiment of the present invention.

FIG. 25 illustrates a flow chart of a method for detecting anomalies in a signal path 2500 according to another aspect of the present invention. The method 2500 may include injecting 2502 a test signal into the signal path to be tested. Although this test signal is usually chosen to be a swept-frequency sine wave, a variety of other test signals, including stepped-frequency sine waves and multi-frequency sine waves may also be used consistent with method 2500. The method 2500 may further include receiving 2504 a reflected signal from the signal path to be tested, which due to the electrical nature of the medium, is superimposed on the test signal. The method 2500 may further include analyzing 506 the phase and amplitude characteristics of the reflected signal superimposed on the test signal to determine the location of anomalies in a signal path.

In another aspect of the present invention, a feedback loop may be used to control the signal generator, similar in the manner to which a phase lock loop operates. For example, as shown in FIG. 21, based on the results from the analyzer 2106, different frequency signals may be generated by the signal generator 2102. In this way, a cable could be scanned at several frequencies to account for the phase wraparound on cables longer than one wavelength. This would be similar to how SWR operates. If pulses are used rather than sinewaves, less computation power would be required.

Figure 27:
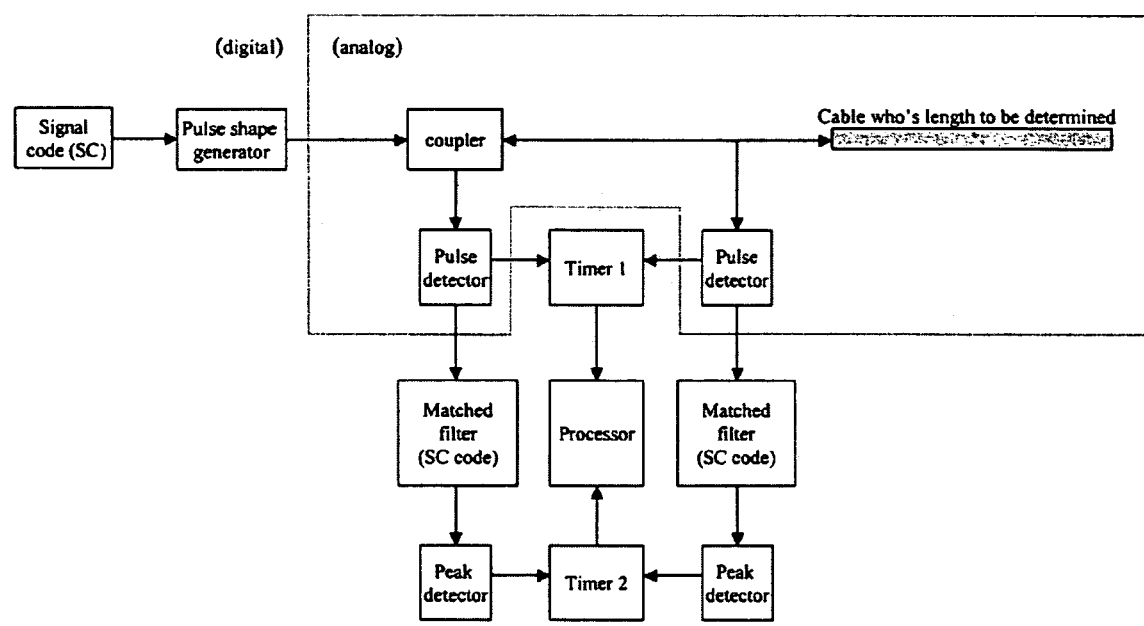
FIG. 27 is a block diagram of a hybrid time correlator sensor in accordance with an embodiment of the present invention.

In another aspect of the present invention, hybrid time and digital techniques may be combined. FIG. 27 illustrates a hybrid time correlator sensor in accordance with an embodiment of the present invention. The hybrid time correlator generates a digital signal code (SC) of a predetermined length. The SC is generated repeatedly to generate an SC stream. The SC may be adapted to particular limitations of the testing environment, such as limitations of bandwidth, multipath, etc. The SC stream is used to drive a pulse shape generator, which produces a train of pulses which may be coupled into the medium. As for the SC, the pulse shape may be adapted or optimized to the requirements of the medium to be tested. For example, a pulse shape which is interference free may be chosen. The pulse stream is coupled into the medium and the medium may produce a reflected signal. For example, if the medium is a wire, anomalies in the wire will result in reflections of a portion of the pulse stream back toward the hybrid time-correlator. The delay between the generated and reflected pulse stream may be measured and used to determine properties of the wire, for example, length and impedance. The time correlation processing will now be described with reference to FIG. 27. Timer 1 is used to determine the inter-pulse delay (delay between pulses), and timer 2 is used to determine the inter-SC delay (delay between repeats of the SC). The total delay is then determined by adding the delays determined by timer 1 and timer 2. Matched filters convert the generated and reflected pulse streams from pulse streams to digital code streams. A direction coupler provides samples of the generated and reflected signal to the time-correlation processing.

Correlation Sensing

Sensing may also be performed using correlation techniques. Correlation based sensing may be performed by injecting an electronic signal into the medium to be testing and observing the properties of the signal reflected back from the media by correlating the reflected signal with the injected signal. Correlation may be performed to observe frequency, phase, amplitude, time offset, or code. Suitable signals for injection may include analog, digital, time domain, frequency domain, wavelets, ultra-wideband pulses, spread spectrum, coded, noise-like, or noise signals. Correlation may be performed using a correlator or a matched filter.

Figure 28:
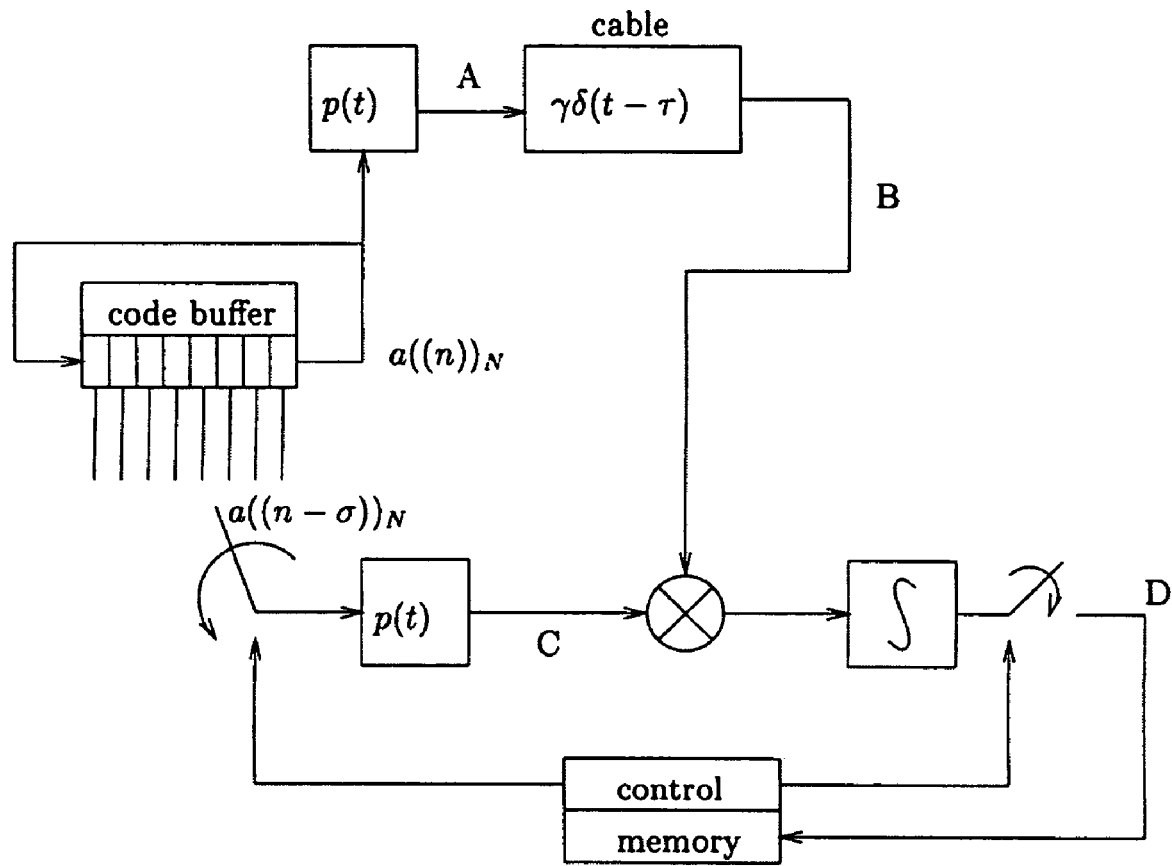
FIG. 28 is a spread spectrum reflectometer (SSR) in accordance with an embodiment of the present invention using the principle of correlation sensing.

FIG. 28 illustrates a spread spectrum reflectometer (SSR) in accordance with an embodiment of the present invention using the principle of correlation sensing. The signal path being tested (also referred to as the cable or wire) may be modeled as a continuous-time invariant system with impulse response $\gamma\delta(t-\tau)$ where $\tau$ is the time required for a signal to propagate from a transmitter (source) to a receiver (destination) over the wire and $\gamma$ is the reflection coefficient.

A spread spectrum signal is used to probe the cable. The spread spectrum signal is generated by a code. As shown in FIG. 28, the code may be generatored by a circularly shifted code buffer. Many different code generators are known in the art, however, which are to be considered within the scope of the presently disclosed inventive concepts. The code is represented herein as a sequence of bits $a(n)$, where $n=0, \ldots N-1$ where N is the number of bits in the code. The code bits are used to modulate a spreading pulse p(t). Although amplitude modulation is presently preferred, phase or other forms of modulation may also be used.

Spread spectrum signals provide several advantages. First is that spread spectrum signals may be generated which have low power and wide bandwidth such that they may be superimposed on top of existing signals so that the cable can be tested while in use. For example, the a low power spread spectrum signal injected into an operating system with be superimposed upon the existing signal within that operating system. If the level of the injected spread spectrum signal is sufficiently low, it will appear as a small amount of noise added to existing signal. If this added noise is below the threshold of tolerable noise for the system, system operation will not be effected.

Second, spread spectrum signals enable high resolution estimation of $\tau$ and $\gamma$.

Third, spread spectrum signals with an appropriately chosen code make the probe signal "self-orthogonal," as described below, leading to efficient algorithms for estimation of $\tau$ and $\gamma$.

Fourth, spread spectrum signals are widely used in wireless digital communications systems making hardware to implement the analog and digital signal processing readily available.

Fifth, carrier modulation of the spread spectrum signal may be performed to shift the signal into a desired frequency band. For example, such shifting may be used to shift the spread spectrum signal into a frequency band different from that used by the operating system to reduce potential interference or disruption of the system operation. Conversely, such shifting may be used to shift the signal into a frequency band corresponding to a range of frequencies that the operating system permits to propagated along a particular signal path.

Sixth, spread spectrum signals enable the detection of multiple reflections which may be estimated simultaneously.

Operation of the system of FIG. 28 will now be explained. The signal at point A and B may be represented as:

A:
$$s(t) = \sum_{n=-\infty}^{\infty} \alpha((n))_N p(t - nT_c)$$

B:
$$s(t - \tau) = \gamma \sum_{n=-\infty}^{\infty} \alpha((n))_N p(t - \tau - nT_c)$$

where by $A((n))_N$ is meant the code sequence a(n) is indexed modulo N (also referred to a circularly shifted). This mathematical notation corresponds to the circular shifting of the code buffer.

The code sequence is self-orthogonal in the following sense:

$$\sum_{n=0}^{N-1} \alpha((n-\sigma))_N \alpha((n-k))_N = \begin{cases} 1 & \sigma = k \\ 0 & \text{otherwise} \end{cases} = \delta(\sigma - k)$$

where $\delta$ is the Kronecker delta.

The parameter $T_c$ is the chip time or chip period. Dividing the time delay T by the chip ttime leads to:

$$\frac{\tau}{T_c} = k + \alpha \quad \text{or} \quad \tau = (k+\alpha)T_c \quad 0 \leq \alpha < 1$$

where k is the whole number of chip times in the cable delay and $\alpha$ is the fractional part of a chip time. If $\alpha=0$ then $\tau$ is in integer multiple of chip times. With this decomposition of the delay, the goal is to estimate the pair (k, $\alpha$). Using the previous two expressions and a change of variables, s(t−τ) can be written as:

B:
$$s(t - \tau) = \sum_{l=-\infty}^{\infty} \alpha((l-k))_N p(t - \alpha T_c - lT_c)$$

The optimum (maximum likelihood) estimator of the time delay (assume white Gaussian noise may also be added by the cable or sensor) is a filter matched to the signal s(t). The position in time of the peak in the matched filter output corresponds to the maximum likelihood estimate of the time delay. A correlation based circuit realization of the maximum likelihood filter is suitable for high frequency hardware implementation. The cross correlation circuit is shown in FIG. 28. The time delay estimate is taken to be the position of the peak in the cross correlation function between the received signal s(t−τ) and a synthetically generated replica s(t−δ$T_c$) at point C in FIG. 28. Although only a single cross correlator is shown in FIG. 28 which sequentially computes the N values of the cross correlation function, multiple cross correlators may be included to allow parallel computation of the N values of the cross correlation function. The signal at point C in FIG. 28 is thus given by:

$$C: s(t - \sigma T_c) = \sum_{l=-\infty}^{\infty} a((n-\sigma))_N p(t - nT_c)$$

This signal is generated by a circular delay of the code bits relative to the code sequence used to generate the probe signal s(t). The output of the correlator at point D is thus given by:

$$r(\sigma) = \int_0^{NT_c} s(t - \sigma T_c) s(t - \tau) dt$$

$$= \gamma \left[ \sum_{n=-\infty}^{\infty} \sum_{l=-\infty}^{\infty} \alpha((n-\sigma))_N \alpha((l-k))_N \int_0^{NT_c} p(t - nT_c) p(t - \alpha T_c - lT_c) dt \right]$$

-continued $$= \gamma \left[ \sum_{n=-\infty}^{\infty} \sum_{l=-\infty}^{\infty} \alpha((n-\sigma))_N \alpha((l-k))_N [\delta(l-n)g(\alpha T_c) + \delta(l-n+1)g([\alpha-1]T_c)] \right]$$

$$= \gamma \left[ \sum_n \alpha((n-\sigma))_N g(\alpha T_c) \sum_l \alpha((l-k))_N \delta(l-n) + \sum_n \alpha((n-\sigma))_N g([\alpha-1]T_c) \sum_l \alpha((l-k))_N \delta(l-n+1) \right]$$

$$= \gamma \left[ \sum_n \alpha((n-\sigma))_N \alpha((n-k))_N g(\alpha T_c) + \sum_n \alpha((n-\sigma))_N \alpha((n-1-k))_N g([\alpha-1]T_c) \right]$$

$$= \gamma [g(\alpha T_c)\delta(\sigma-k) + g([\alpha-1]T_c)\delta(\sigma-k-1)]$$

where the final step in the derivation above is enabled by the orthogonality property of the spreading code. The function g(t) above is equal to the autocorrelation function of the pulse p(t), given by:

$$g(\omega) = \int_0^{NT_c} p(t)p(t-\omega)dt$$

Although the above derivation has assumed that p(t) is time limited to a single chip period, this should not be considered limiting. Pulses that extend past a single chip period may also be used, although the final expression for r(σ) is no less useful although more complicated.

An examination of the cross correlation function reveals that r(σ) is equal to zero except when δ is equal to k or k+1. Recall that k is that the integer number of chip periods in the unknown delay τ. The function g(t), which is known, can be used to extrapolate between the non zero samples r(k) and r(k+1) to obtain the fractional delay α and the reflection coefficient γ.

Multiple reflections are also possible. If there are L reflections present, the wire may be modeled by:

$$\sum_{i=1}^{L} \gamma_i \delta(t-\tau_i)$$

where $\gamma_i$ and $\tau_i$ are the reflection coefficients and time delays i=1, . . . L. The time delays may be written in terms of whole and fractional parts:

$$\tau_i = (k_i + \alpha_i)T_c$$

All of the signal processing operations involved in calculating the correlation-based detector are linear and time invariant. Therefore, the correlator output is given by:

$$r(\sigma) = \sum_{i=1}^{L} \gamma_i [g(\alpha_i T_c)\delta(\sigma-k_i) + g([\alpha_i-1]T_c)\delta(\sigma-k_i-1)]$$

If all of these pulses are non-overlapping then each of the reflections may be resolved individually. If some of the reflections are closely spaced, then Fourier based techniques as described within this disclosure and known to those skilled in the art may also be applied to extract the time delays.

FIG. 25 illustrates a block diagram of a NDR-I 100 in accordance with the present invention. An NDR-I 3500 may include a variable delay 3508 for accepting a portion of a noise-like operational signal source 3502 being input into the signal path under test 3504 and a reflected signal 3504 from the output of the signal path under test. While the input signal provided by noise-like operational signal source 3502 is "noise-like" for purposes of this embodiment, any input signal may be used, noisy or not. However, broader bandwidth input signals will provide better the accuracy according to the apparatus, system and method embodiments of the present invention. NDR-I 3500 may further include a multiplier 3510 in communication with variable delay 3508 and in communication with reflected signal 3504 from the output of the signal path under test. NDR-I may further include an integrator 3512 in communication with multiplier 3510.

The portion of the noise-like operational signal source 3502 which is input to the signal path under test is reflected back towards the noise-like operational signal source as reflected signal 3504 by discontinuities in the signal path under test. This results in a reflected signal 3504 from the output of the signal path under test. The portion of the noise-like operational signal source 3502 is delayed by variable delay 3508, to produce a delayed reference signal 3514. The delayed reference signal 114 and reflected signal 3504 are then multiplied together by multiplier 3510. The result 3516 is then integrated by integrator 112 to yield a correlation value.

This correlation value will be large when the variable delay 108 has been set equal to a delay value corresponding to a round-trip distance to a discontinuity in the signal path. For operational system signals with good shift correlation properties, large correlation values will only be observed at delays corresponding to discontinuities in the signal path. Where an operational system uses binary digital signals, greater simplification and cost reduction can be achieved by using a memory or other digital storage as variable delay 108 and by using an XOR, XAND, AND, or NAND logical functions as multiplier 110.

The choice of binary multiplication method depends on the nature of the operational binary signal. Of course, those skilled in the art will also recognize that other types of correlators may be used consistent with the present invention.

FIG. 2 illustrates a NDR-II 3600 in accordance with the present invention. NDR-II 3600 may include a variable delay 3608 in communication with a signal path under test 3618. NDR-II 3600 may further include a multiplier 3610 in communication with variable delay 3608 and in communication with a signal path under test 3618. NDR-II 3600 may further include an integrator 3612 in communication with multiplier 3610.

The NDR-II 3600 only requires a single connection to a signal path under test 3618. A noise-like operational signal source provides operational signal 3602 into the signal path under test 3618. Operational signal 3602 will be reflected back towards the noise-like operational signal source by discontinuities in the signal path under test as a reflected signal 3604. Because the operational signal 3602 and reflected signal 3604 share the same signal path under test 3618, the reflected signal 3604 is superimposed on the operational signal 3602 to produce a combined operational and reflected signal 3606. The combined operational and reflected signal 3606 is provided to variable delay 3608. Variable delay 3608 produces a delayed combined signal 3614. The combined signal 3606 and delayed combined signal 3614 are then multiplied together by multiplier 3610 to produce result 3616. Result 3616 is then integrated by integrator 3612 to yield a correlation value.

The correlation value will be large when the variable delay 3608 has been set equal to a delay value corresponding to a round-trip distance to a discontinuity in the signal path under test 3618. When multiple discontinuities are present in the signal path under test 3618 the correlation value will also be large when the variable delay 3608 has been set equal to a delay value corresponding to the delay difference between different discontinuities. Hence, a series of correlation peaks will result from each discontinuity. These series of peaks can be interpreted as discussed in Appendix A to determine the delay values corresponding to the discontinuities in the signal path under test 3618.

Figure 37:
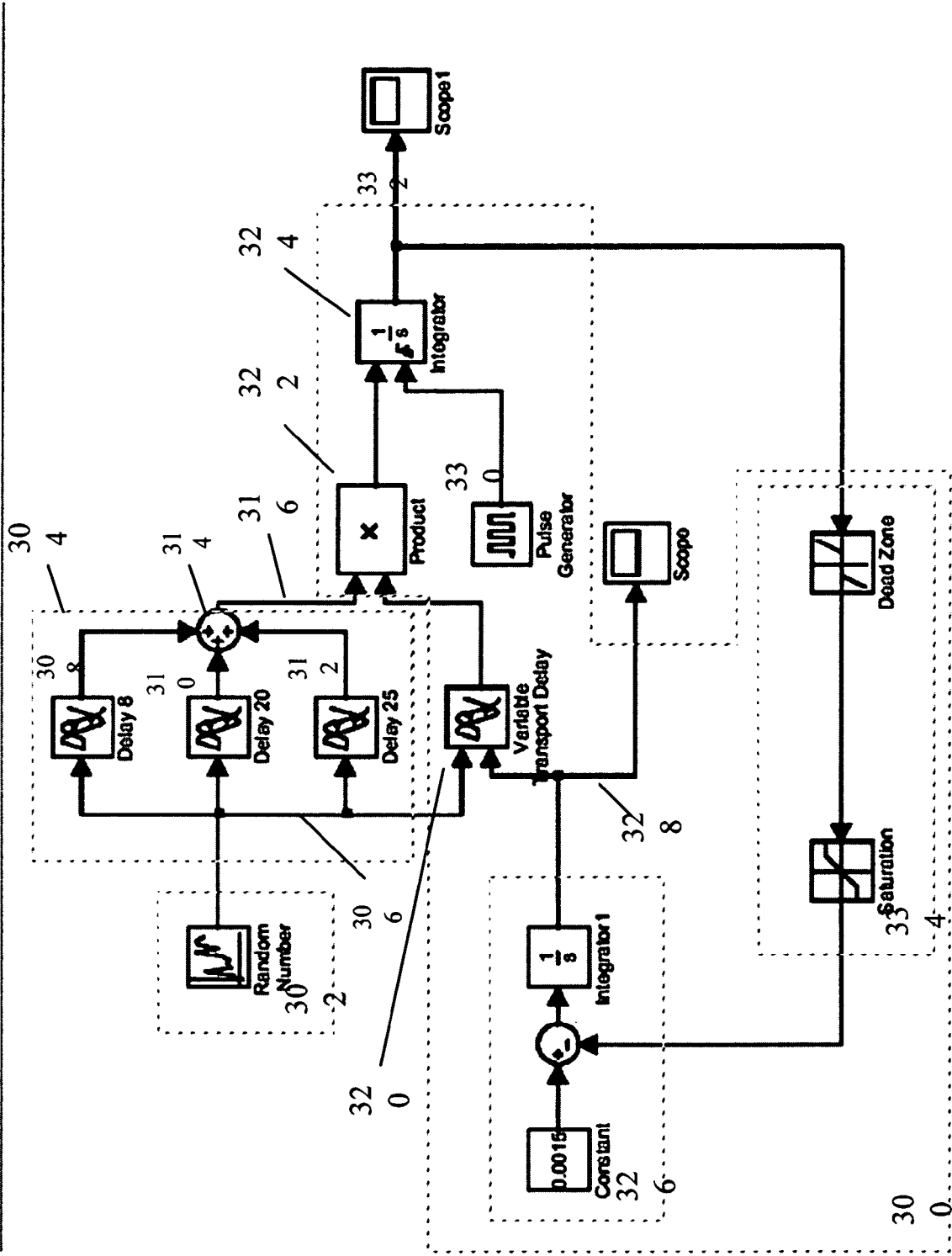
FIG. 37 is a block diagram view of a simulation of a NDR-I in use to test a simulated signal path in accordance with another embodiment of the present invention.

FIG. 37 is a block diagram of a simulated NDR-I 300 according to the present invention. NDR-I 300 is connected to an operational system represented by random number generator 302 and signal path under test 304. Random number generator 302 provides a series of random numbers that simulate a noise-like operational signal source. The simulated noise-like operational signal 306 is input to the signal path under test 304 and is provided to the simulated NDR-I 300 at 306. Three discontinuities are simulated in the signal path under test by using three delays 308, 310, and 312. The delayed versions of the simulated noise-like operational signal are summed 314 to produce a simulated reflected signal 316. The simulated reflected signal 316 is also provided to the simulated NDR-I 300.

Figure 38:
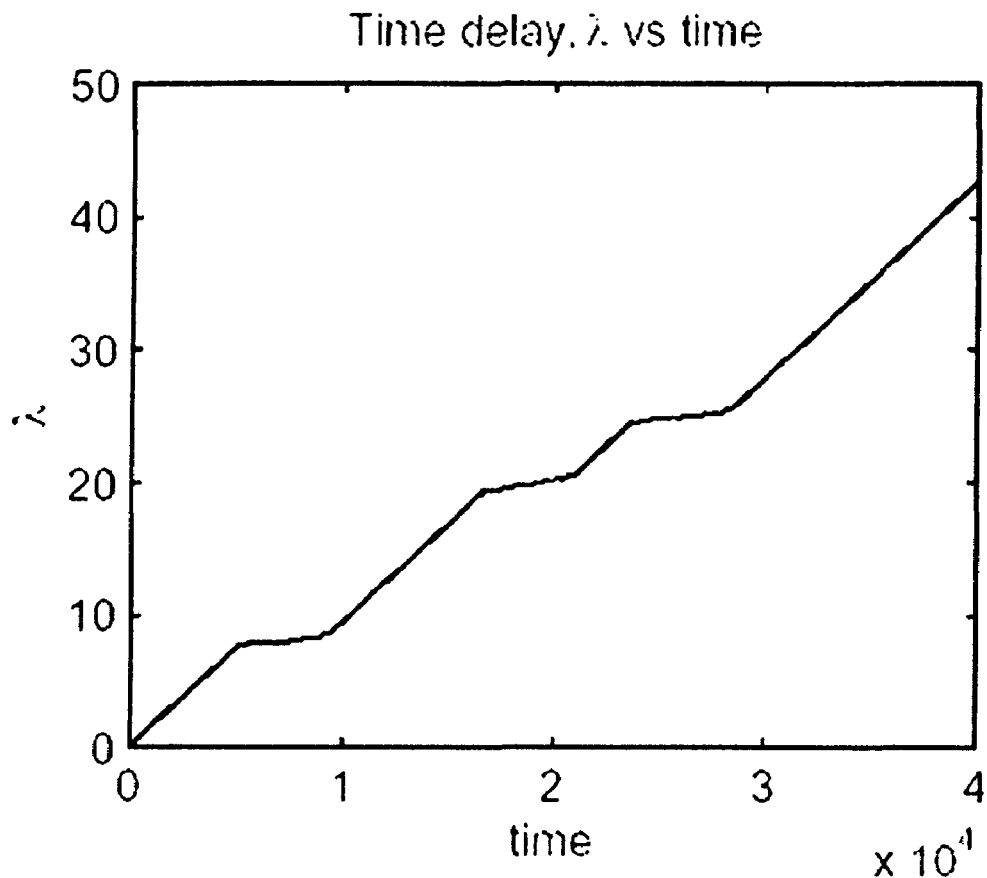
FIG. 38 is a graph of the delay control versus time for a NDR-I in accordance with another embodiment of the present invention.

The NDR-I 300 may include a variable transport delay 320, a product detector (multiplier) 322, and integrator 324. The simulated noise-like operational signal 306 is provided to the variable transport delay 320. The variable transport delay 320 produces a variable amount of time delay determined by the delay value. The delay value 328 is generated by delay control 326. The delay control 326 produces a delay value 328, starting from a minimum delay and steadily increasing to a maximum delay, corresponding to the range of delays to be searched for discontinuities in the signal path under test 304. In this simulation, the time delay, 8, varies from 0 to 42 as a function of time, as illustrated in FIG. 38.

Figure 39:
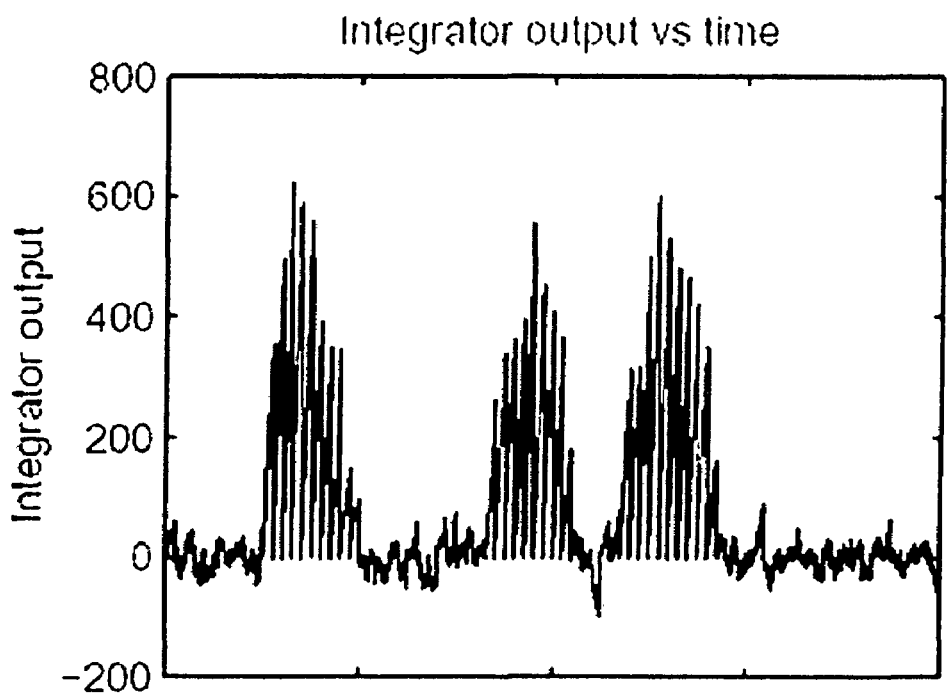
FIG. 39 is a graph of the integrator output versus time for a NDR-I in accordance with another embodiment of the present invention.

Product detector 322 multiplies the simulated noise-like operational system signal 306 by the reflected signal 316. Integrator 324 integrates the output of the product detector 322. The integrator 324 is periodically reset to zero by pulse generator 330. The resulting correlation result 332 computed by the integrator 324 is illustrated in FIG. 39. Alternative arrangements where the integrator 324 is not periodically reset may also be used. In such an alternative arrangement, large correlation values may be detected by observing rapid increases in the output of the integrator 324.

The integrator output 332 is fed back through a rate control 334 to delay control 326. This rate control 334 reduces the rate at which the delay control 326 increases the delay value 328 when there is a sufficiently large correlation value output from the integrator 324. The correlation value output from the integrator 324 is large when the variable delay corresponds to a problem in the signal path under test 304. Large correlation values result in the rate control 334 slowing the rate at which the delay value 328 increases. This improves the accuracy of determining the location of discontinuities in the signal path under test 304.

Figure 40:
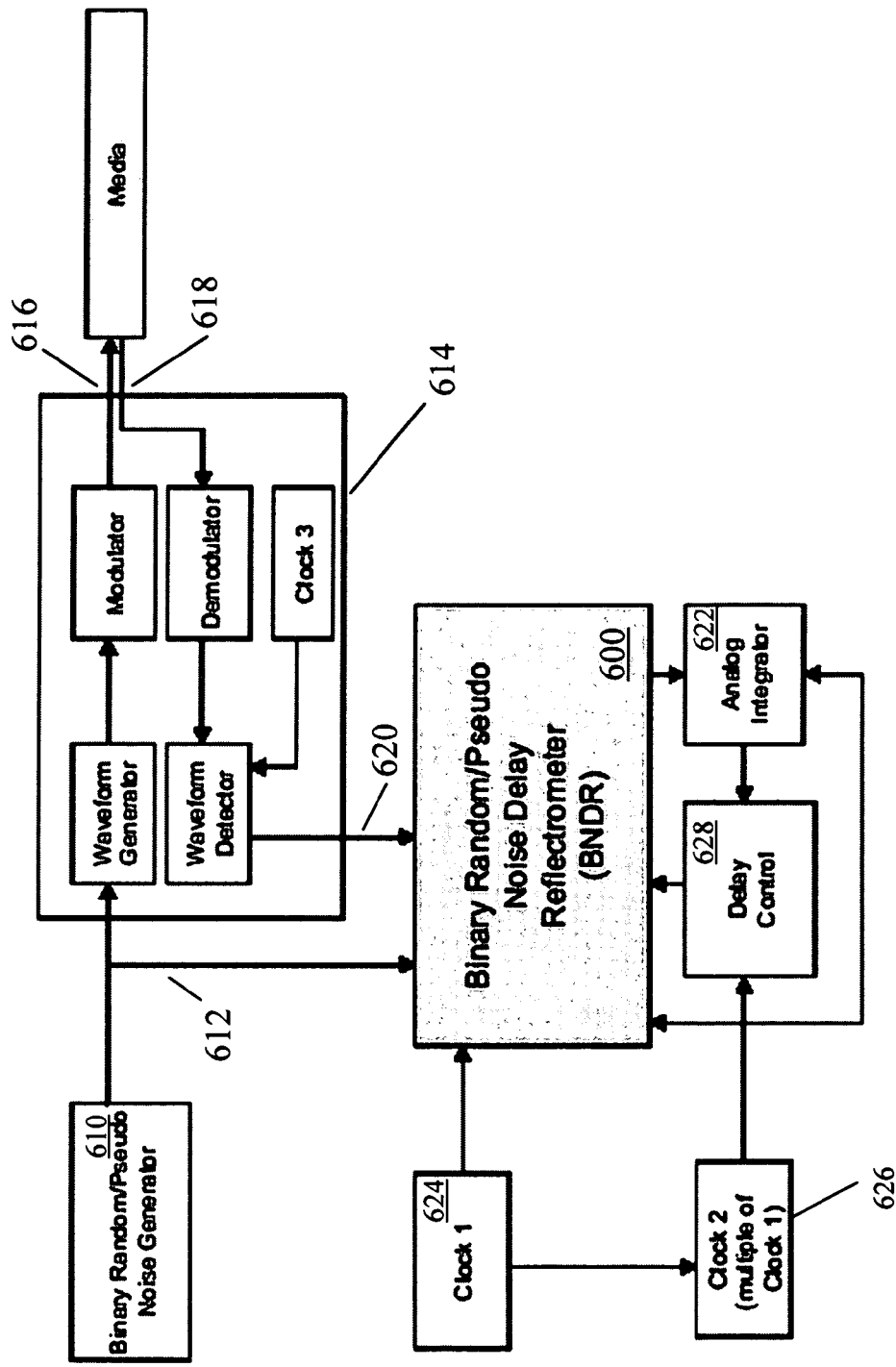
FIG. 40 is an overall block diagram of a Binary/Pseudo Noise Domain Reflectometer—Type I (BNDR-I) with Media Interface and Noise Generator in accordance with another embodiment of the present invention.
Figure 41:
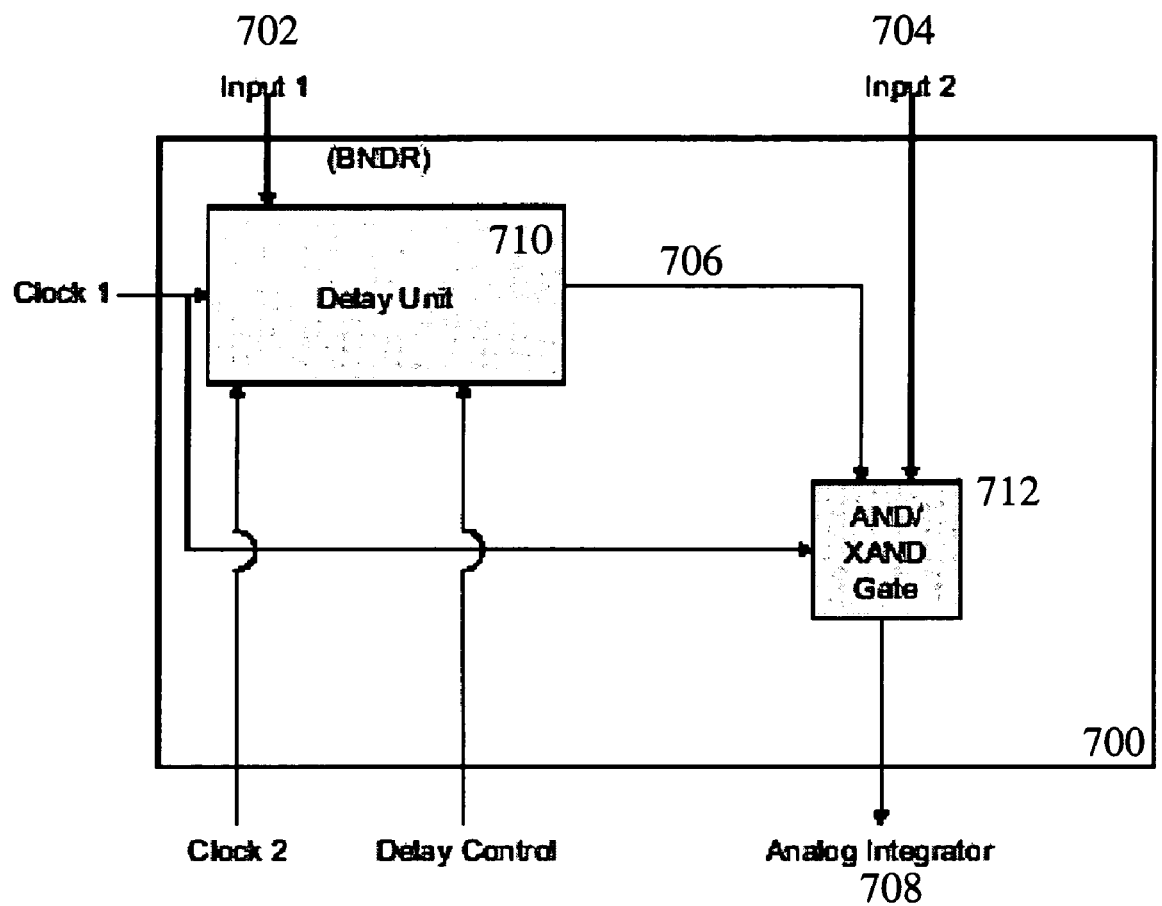
FIG. 41 is a detailed block diagram of a Binary/Pseudo Noise Domain Reflectometer.
Figure 42:
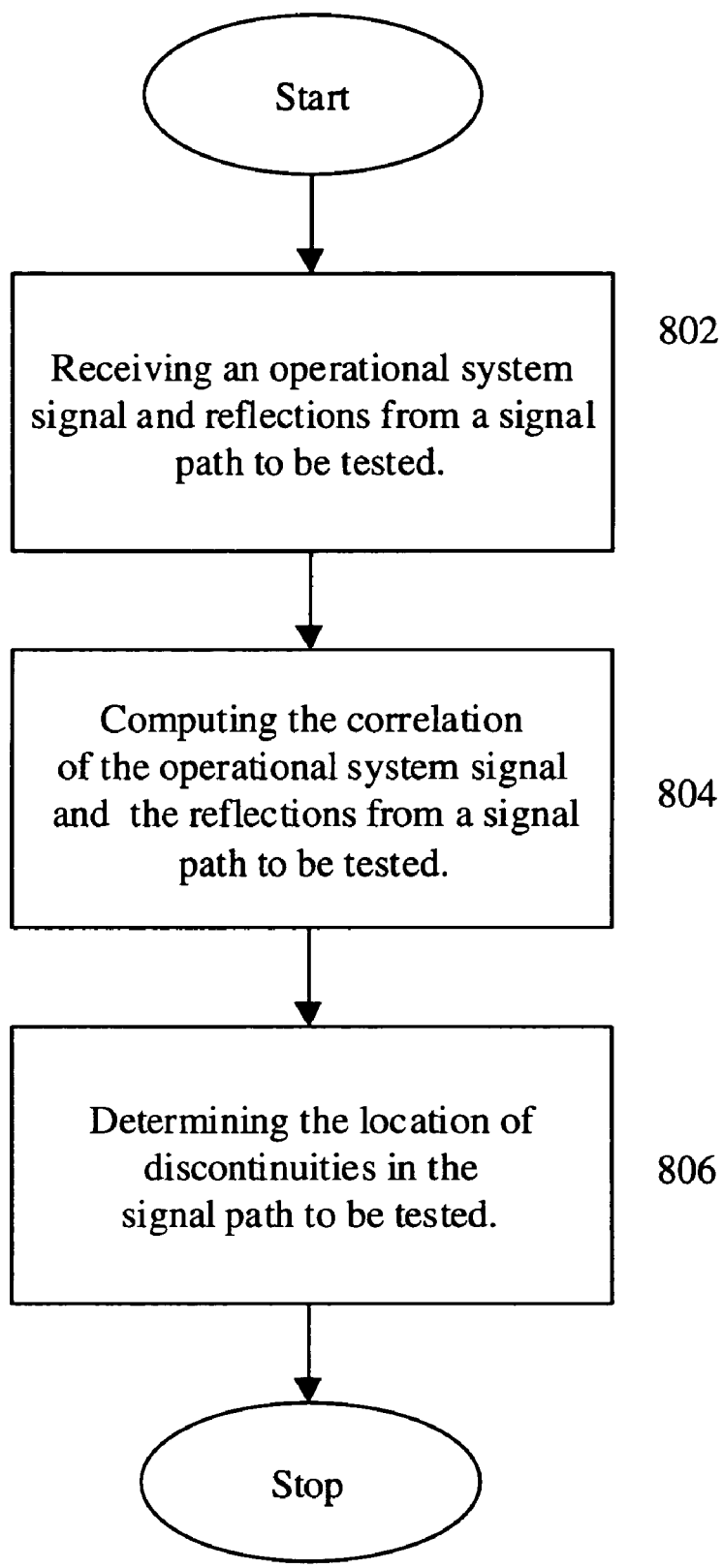
FIG. 42 is flow chart of a Method for Noise Domain Reflectometry in accordance with an embodiment of the present invention.

FIGS. 40-42 correspond additional embodiments of an NDR-I. FIG. 40 illustrates a block diagram of a BNDR-I 600 with media interface 614 and binary random/pseudo noise generator 610 in accordance with the present invention. The binary random/pseudo noise generator 610 generates a noise-like signal 612. Where the operational system signals do not exhibit low shift-correlation, it may be preferable to inject a noise-like signal 612 into the system. This noise-like signal 612 may be selected to have low shift-correlation properties. This noise-like signal 612 may be superimposed on the operational system signals without causing interference to the system by limiting the amplitude of the noise-like signal 612 to be less than the operating noise margin of the operational system. Although this noise-like signal can take on a variety of forms, if a binary digital noise-like signal is chosen, all of the previously discussed benefits of a simple digital implementation are realized.

The noise-like signal may 612 be injected directly into the system, or may be injected by an optional media interface 614. The media interface 614 provides translation between the format of the operational system signals and a more convenient format for use in the BNDR-I 600. More specifically, the media interface 614 will translate the noise-like signal 612 into the operational system signal 616, and will translate the reflected signal 618 into a translated reflected signal 620. For example, the media interface 614 may provide translation between binary digital signals used within the BNDR-I 600 and analog signals used by an operational system. As another example, the media interface 614 may provide translation between low frequency wired signals used within the BNDR-I 600 and high frequency wireless signals used by an operational system.

The media interface 614 can also be used in an NDR-II configuration by eliminating the binary random/pseudo noise generator 610. In this case, the media interface 614 provides translation from the operational system signal 616 to a translated system signal, which is then provided via path 612 to the BNDR-I 600.

The BNDR 600 accepts the noise-like signal 612 and translated reflected signal 620. A particular embodiment of a BNDR 600 is illustrated in further detail in FIG. 41, shown generally at 700, according to the present invention. As discussed previously, the noise-like signal 702 is fed to the delay unit 710 via input 1 to produce a delayed version of the noise-like signal 706. The delayed version of the noise-like signal 706 is fed to an AND/XAND 712. The translated reflected signal 704 is fed to a second input of AND/XAND 712. The logical AND/XAND 712 functions as a binary multiplier, the result of which is output 708. Output 708 is fed to the analog integrator 622 shown on FIG. 6.

Clock 1 624 and clock 2 626 provide overall control of the BNDR 600. Clock 1 624 provides the basic sample timing for the BNDR 600 and will clock multiple times for each delay value under test. Clock 2 626 is a multiple of clock 1 and provides the increment of the delay control, increasing the delay to be tested each time it clocks. Clock 2 626 also resets the integrator 622 and loads the new delay value 714 into the delay unit 710.

Note that a BNDR-I is a special binary case of an NDR-I. There is also a binary version of an NDR-II, referred to as BNDR-II. The details for implementing BNDR-II given this disclosure are within the knowledge of one of ordinary skill in the art and, thus, will not be further elaborated on herein.

FIG. 42 illustrates a method for detecting discontinuities in a signal path in accordance with one aspect of the present invention. The method may include receiving 802 an operational system signal and reflections of that signal from a signal path under test. The method may further include computing 804 the correlation of the operational system signal and reflections from a signal path under test for a range of delay values. The method may further include determining 806 the location of discontinuities in a signal path by examining the delay values corresponding to peaks, or series of peaks, in the correlation.

Another novel application of the present invention may be achieved by combining a MSR with a Noise Delay NDR.

The combination of a MSR and NDR allows an MSR to be used to detect signal path integrity problems without requiring a system to be shut down.

With respect to the correlation methods of sensing, including the spread spectrum and noise domain reflectometer, the use of noise-like signals makes possible live testing. For example, the signal generator may be set to produce a signal which is sufficiently small that it does not disrupt system operation. Adequate signal to noise ratio to make a measurement of the wire properties will be obtained during the correlation process, especially if the generated signal is sufficiently wide bandwidth, or the code used is sufficiently long.

Physical Embodiments

Some of the devices where the present invention can be used include a stand-alone dedicated device, an integrated assembly within system component, an add-on into an existing system component, a multi-function measurement device, a laptop computer, a desktop personal computer, in the insulation of the wire, in a connector between wires, on a circuit board that can be installed in after-market devices, in an arc-fault circuit breaker, in a battery, in an add-on assembly for insertion between a probe and mult-function meter, and in probes that can be used with after-market devices.

The stand-alone and multi-function measurement devices are of particular importance. Consider a FLUKE™ multimeter device. The timer circuit board can be installed inside the FLUKE™ device so that measuring short circuits and open circuits is simply another option on a dial. The handheld device would have the capability of displaying the distance, for example, in meters to the anomaly. In those situations where the timer circuit is an aftermarket addition, the handheld device may display the voltage, and then the user would translate the voltage to a distance reading.

Figure 34:
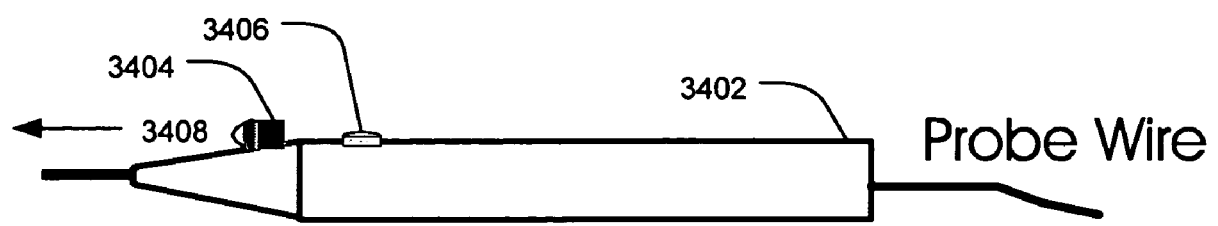
FIG. 34 is an illustration of a lighted probe in accordance with another aspect of the present invention.
Figure 35:
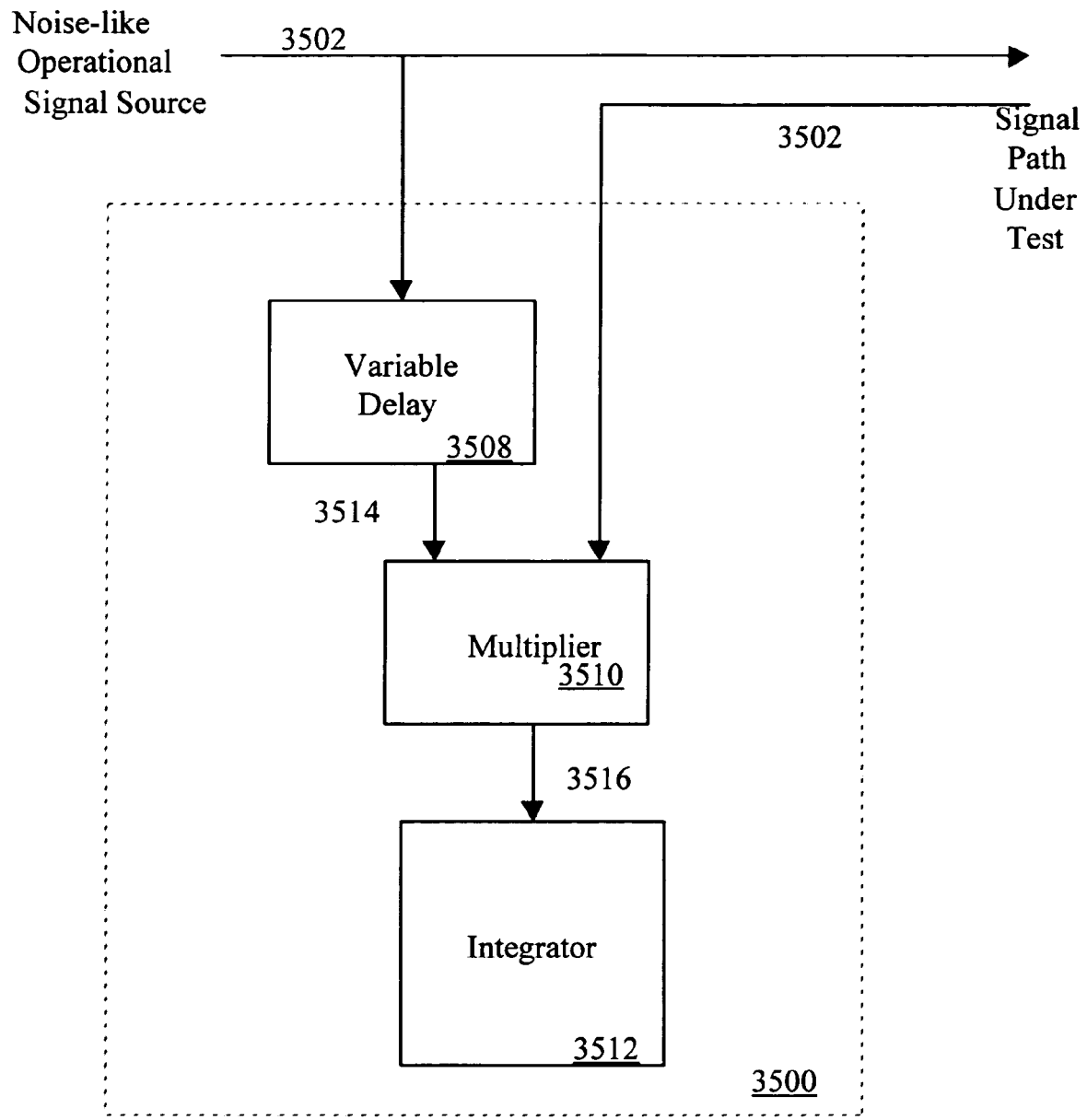
FIG. 35 is a block diagram view of a NDR-I in accordance with an embodiment of the present invention.
Figure 36:
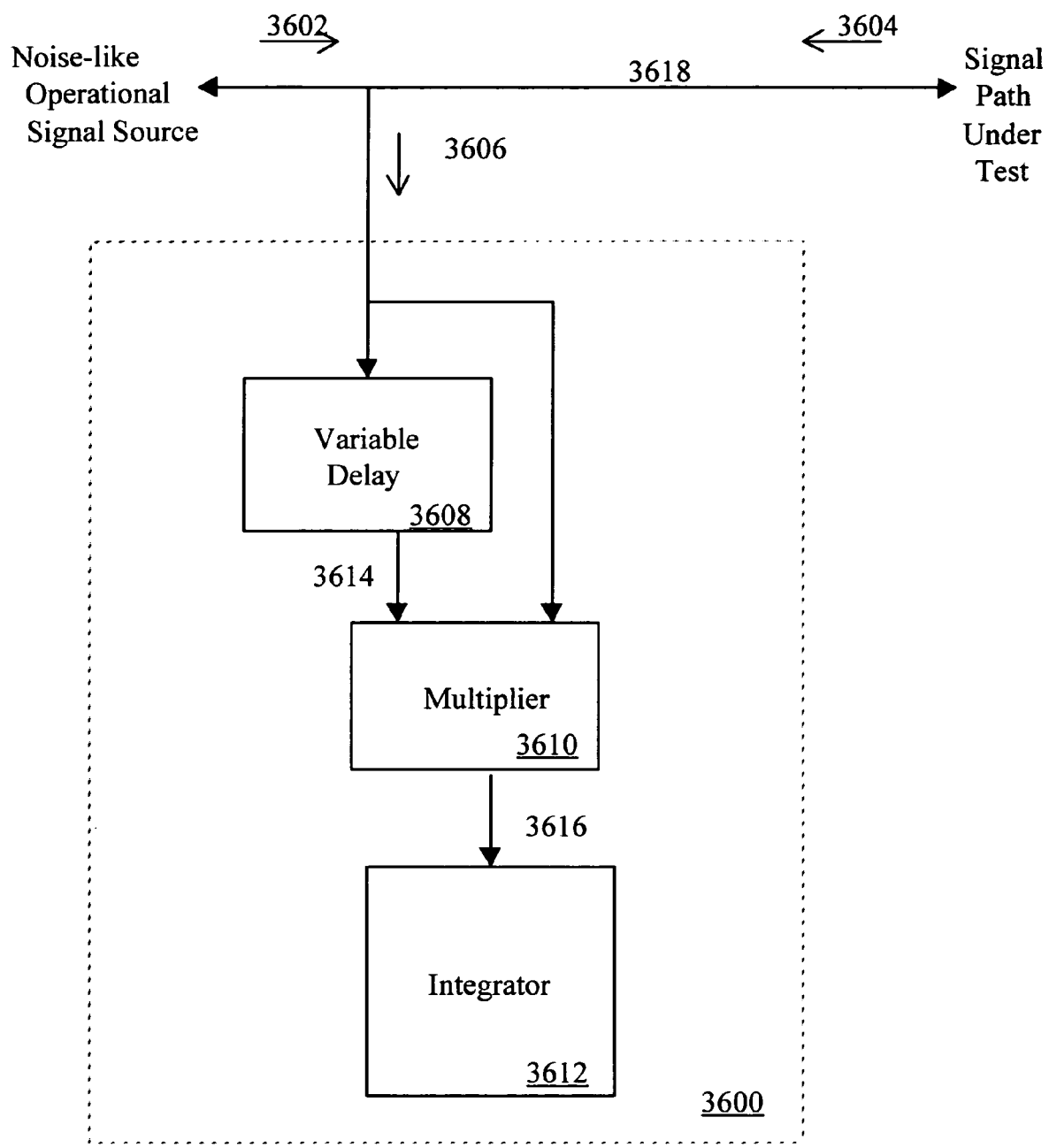
FIG. 36 is a block diagram view of a NDR-II in accordance with another embodiment of the present invention.

When using a probe to measure voltage, current, distance to an anomaly and other measurements, it is necessary for the probe tip to touch the test point of the circuit or wire to be measured. When making such measurements, access and visibility may be limited, for example, when testing wires inside the structure of an aircraft. FIG. 34 illustrates an embodiment of another aspect of the present invention in the form of a lighted probe. As shown in FIG. 34, the handle 3402 of the probe includes a light source 3404 and a switch 3406. The light source 3404 may be mounted on or molded into the handle 3402. The light source can be turned on by a user using the switch 3406 and provides illumination in the direction 3408 of the wire or circuit being probed. The light source 3404 can be a light bulb or light emitting diode.

Such a handheld device might be provided with a connector that allows easy connection of the device to a connectorized wiring harness. A multiplexer or switch could be used to switch to each wire in the harness individually. This greatly increases the convenience of such a test instrument and the reliability of test results, since the user need not move a probe to each wire or connector pin.

The handheld device has been described as a FLUKE™ multimeter device. However, there are other handheld computational and measurement devices that can also be used. For example, consider the Juniper™ Ruggedized Handheld PC.

The circuit board can also be constructed to fit into a slot in a measurement device, wherein the slot is provided so that functionality can be added to existing devices. Thus, the ability to retro-fit existing devices is an important aspect of the invention.

Figure 30:
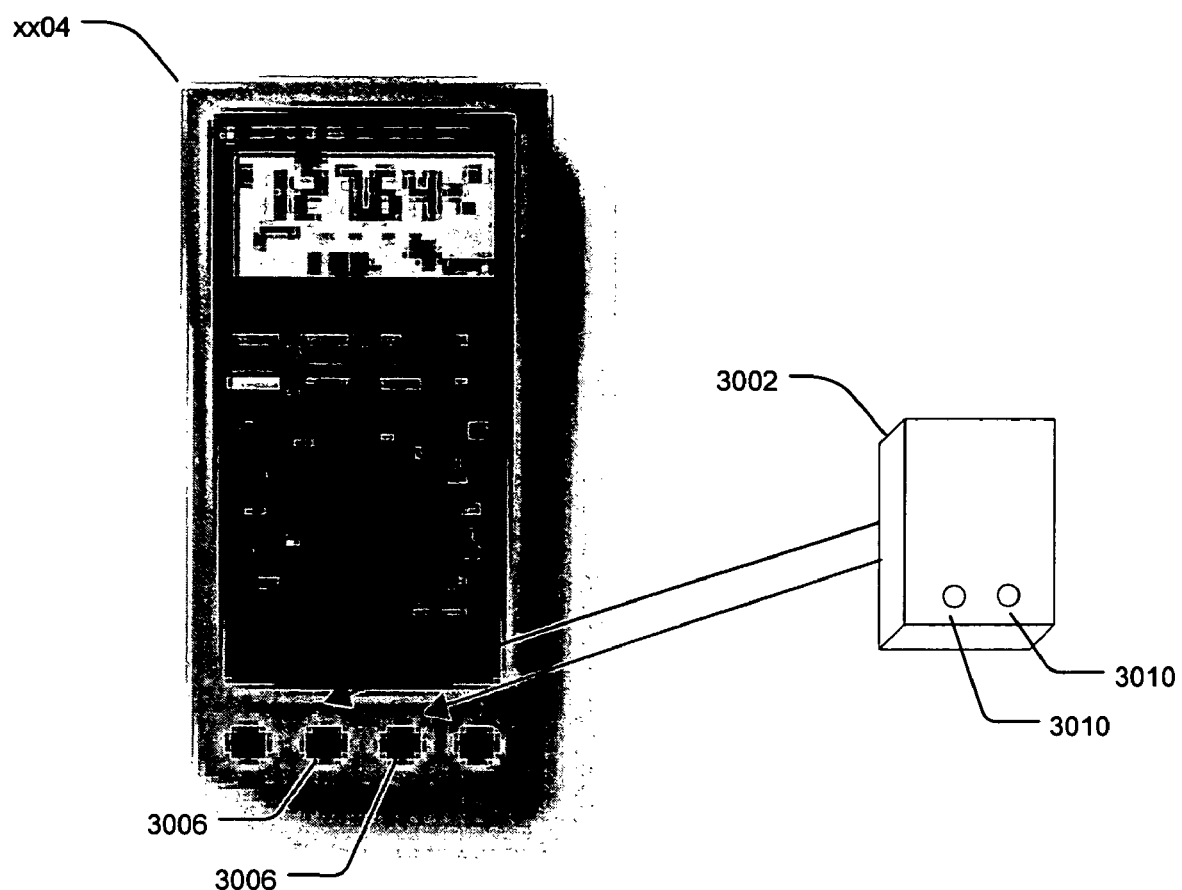
FIG. 30 is a diagram showing an integrated device in accordance with an embodiment of the present invention.

More specifically, consider a digital voltmeter that does not have an expansion slot. FIG. 30 illustrates another embodiment of the present inventive concepts. An integrated sensing or reflectometer device 3002 can be disposed into the instrument probe lead socket or sockets 3006 of a an instrument 3004, such as a multi-meter or digital voltmeter. The integrated device 3002 combines a tester, such as a capacitance sensor, mixed signal reflectometer, hybrid reflectometer, or spread spectrum reflectometer, as disclosed within in accordance with the present invention, or other test device; a battery or other power source; test leads; and a connection to the instrument 3004. The integrated device 3002 provides a voltage to the instrument 3004 that can display a voltage reading that can be interpreted to determine the distance to a short or open circuit, depending upon the type of measurement being made. This enables the instrument to make new measurements with the aid of the integrated device that were not previously possible. For example, a digital multimeter, in combination with an integrated device incorporating a reflectometer may be enabled to measure wire lengths, distances to shorts, or distance to open circuits. A series of integrated devices may be provided to enable a digital multimeter to perform a new types of measurements not provided by the multimeter alone. Hence, the utility of the multimeter is greatly enhanced.

Figure 31:
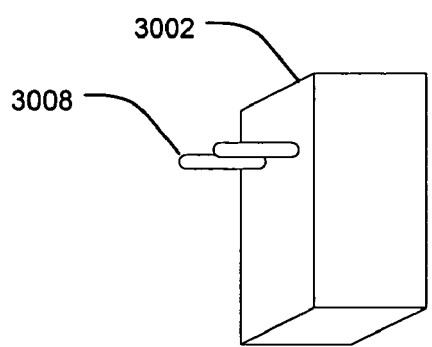
FIG. 31 is a side view of the integrated device of FIG. 30.

This design also provides a small, conveniently used and transported addition the instrument. FIG. 31 illustrates a side view of the integrated device 3002. The integrated device 3002 can be snapped into the sockets of the instrument 3004 via jacks on the back 3008, or could be connected via leads (not shown) to the sockets 3006 of the instrument. Probes may then be inserted into the sockets 3010 (FIG. 30) on the integrated device 3002.

Although the jacks 3008 and sockets 3004, 3010 are shown in the form of "banana" type plugs and sockets, various other types of connectors known in the art may be used, including F, BNC, and SMA connectors, and are to be considered within the scope of the invention.

Figure 32:
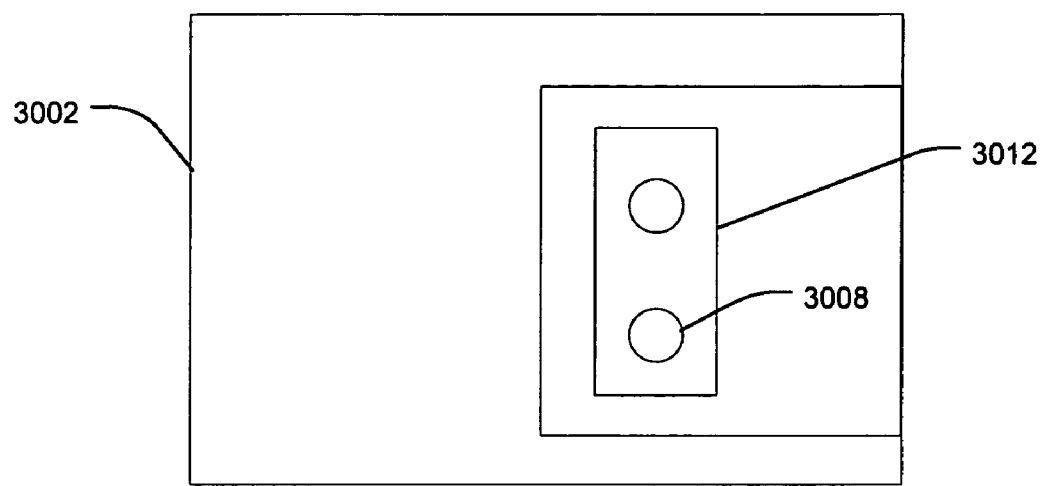
FIG. 32 is a read view of another embodiment of the integrated device of FIG. 30.
Figure 33:
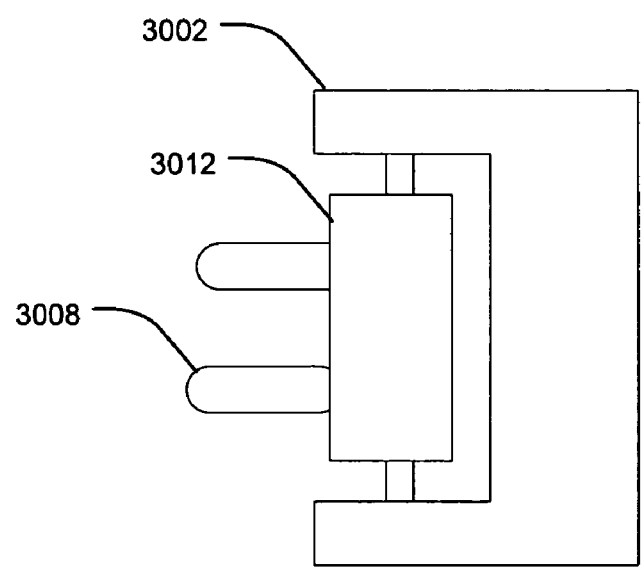
FIG. 33 is a side view of another embodiment of the integrated device of FIG. 30.

FIGS. 32 and 33 illustrates a top and rear view, respectively, of another embodiment of the integrated device 3002 further showing the jacks 3008 may be configured on a rotatable assembly 3012 such that the jacks can be folded in for convenience in transport.

It is envisioned that, when measurements are taken, the measurements will use the open circuit and the short circuit modes of the timer circuit in order to determine if either condition exists. The add on determines the distance of a fault or the length of the wire, and converts this to a voltage that is output to the multi-meter. The user interprets this voltage measurement as a distance or length. For example, a voltage of 3.2 V may be output to indicate a distance of 3.2 meters, and positive or negative voltages may be used to indicate a short or open circuit.

The versatility of where the present invention can be implemented should now be apparent. Owing to the low cost, small size, and simplicity of design, the present invention can be integrated directly into new products, function as a stand-alone device, or be manufactured as an add-on for use in combination with other devices.

The arc-fault circuit breaker is an application of particular importance. A circuit breaker is a commonly available junction point in a circuit. Arc faults can be very small, and even invisible to the unaided eye. It is very difficult to be able to repair the wire if the fault cannot be seen. The present invention enables the arc-fault to be determined to a high degree of accuracy. The present invention may be integrated into existing or new circuit breakers, or otherwise placed within a circuit breaker panel. Power required to operate the present invention may conveniently be obtained directly from the wire signal path tested.

The technology disclosed herein may be used to locate arcs, i.e., small intermittent short or open circuits. The reflectometer detects the location of short and open circuits. Even if the circuit path under test is not fully open or short-circuited and an intermittent arc occurs, a "peak" in the response will appear that represents the location of the arc. Several readings may be stored, and compared sequentially. The maximum differences between the average or median of the readings may be obtained. The arc will show up as a peak in the maximum difference data at the location proportional to the location of the arc.

The present invention could also be integrated into the connectors of a wiring harness.

Existing connectors may be replaced or a separate "connector-saver" that has male pins on one side and female sockets on the other so that the existing connectors may be plugged into either side of this connector-saver. The new connectors and connector-saver would each contain the presently disclosed inventive techniques, permitting in-system testing for anomalies within the wiring harness.

There are a number of options in powering a connector with the present invention integrated within. For example, the connector could connect to power within the bundle being tested. Alternatively, the connector could include a battery (possibly rechargeable). Yet another alternative in the context of aircraft wiring, the connector could scavenge power from the aircraft surroundings using vibration, thermal changes, or other well-known power scavenging methods.

In addition, it is desirable for these connectors to provide a communication interface to get anomaly data back to a central location for examination by a maintenance technician, pilot, remote decision-making interface, or the like. In order to do this, each connector may include a communication link that could be either hard-wired or wireless, e.g., RF, IR, etc. The connector may be examined visually or individually. The examination may be facilitated with a set of LED outputs, or a hard-wired or wireless connection between a handheld PDA, for example and not by way of limitation.

If there are more than two wires within the bundle, the connector may include a multiplexer or set of switches to test each of the wires separately. Alternatively, several embodiments of the present invention could be built into a single chip, imbedded into the connector and could test the set of several wires simultaneously.

It has been contemplated that as the electronics for the present invention are reduced in size by manufacturing improvements and miniaturization, that it could be imbedded directly within a roll of wiring. Multiple or single units might be included within a roll of wiring. This application is particularly appealing for new types of wires that are being examined that are extruded and could be connected onto small circuit boards rather than the traditional connectors or for wires that are built on rolls of high-impedance plastic. These are the same materials, in some cases, that flexible circuit boards can be built on and, thus, that the MSR chip could be attached to.

An in-wire device is also made possible by the present invention because the size of the timing circuit can be small enough to actually be disposed in the insulation around a wire. The circuit can be actuated to make periodic measurements, and even continuous measurements, depending upon the circumstances.

One of the more immediate applications of the present invention is the ability to use a handheld device for testing wires for short and open circuits. For example, airplane wiring can be tested using the present invention, even when there is no return path. Thus, a single wire can be tested.

The present invention can also be used to detect frayed wiring. Frayed wiring is especially difficult to detect, but the present invention is capable of detecting very small anomalies in the wire, such as arc-faults that are too small to see with the unaided eye.

The technology may also be used to test wiring networks, such as those found on aircraft. It is noted that many times wires branch throughout the plane, so that when a tester in accordance with the present invention is connected to a single connector, it may actually be testing a series of wires with multiple branches, much like the branches of a tree. Each junction between two wires and the end of each branch will produce a reflection. In addition, there are multiple reflections as the reflection from the end re-enters the branch, and both transmits towards the source and reflects back towards the load. Each reflection and multiple reflections will show up as a peak in the MSR system, where the round-trip distance that each reflection has traveled will be proportional to the location of the peak. The system will also show multiple peaks, where the difference between the round trip distances shows up in the location of the peaks. There are several ways of determining the shape of the cable tree, and hence where a fault has occurred as noted above.

Once the delay(s) in the system caused by the reflections in the wiring network have been determined, the delay(s) can be used to find the signal. The data on a line in the wiring network is the sum of the initial signal and a delayed and possibly attenuated version of signal. This is commonly done in communication systems. One common way of doing this is to use a matched filter (digital or analog), a "rake" receiver, or any other type of correlator or synchronizer. The reflected signal or sum of reflected and incident signals is progressively delayed and compared or correlated to the original signal. When the delay(s) is the same as the delay(s) obtained from the path (the network of wires or the multipath environment of the communication system), the signals are highly correlated (they are "identical"). This gives a correlation peak (the same peak that the MSR uses to determine the length of the line). The signals can be simply added together to obtain the original signal (as they are in a "RAKE" receiver, for instance).

This data-extraction method is useful in a high-speed data network because if the line breaks, all users, not just those beyond the break, are unable to receive the data because it is corrupted by the reflected signal. This data-extraction method can be used to allow the system to "self-heal," so that all users connected prior to the break on the line are still able to receive data. In "ring networks" that connect all users in a circular fashion, this would ensure that all users could continue to receive data. This method could be used as a temporary "fix" until maintenance personnel arrived. Additionally, when maintenance personnel did arrive, the system could convey the specific location of the fault for quick repair.

Ranging and Jam Resistant Communication

Another embodiment for the disclosed invention is ranging, i.e., finding the distance. For example, the present invention may be used for determining a distance between two wireless transmitters or for ranging in radar or other wireless applications using the same principles for anomaly location as previously described. Although discussed in the context of wireless range finding, it is to be understood that this technique is equally applicable to testing of wired systems in a manner similar as discussed for the previous correlation based sensing.

Figure 29:
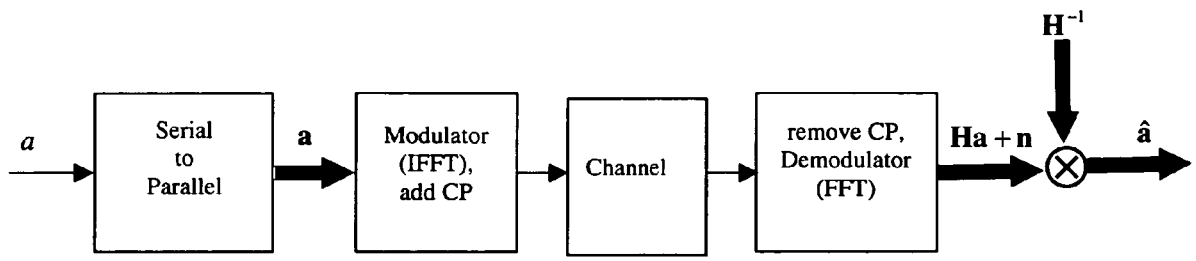
FIG. 29 is an OFDM transceiver system in accordance with an embodiment of the present invention.

FIG. 29 illustrates an OFDM transceiver system in accordance with an embodiment of the present invention based on the method of orthogonal frequency division multiplexing (OFDM), wherein each data symbol is spread over a number of subcarriers in order to achieve jam-resistance.

OFDM is a special multicarrier modulation which uses the properties of the discrete Fourier transform (DFT) in an elegant way so as to achieve a computationally efficient realization. A fast stream of data symbols, a, is branched into a parallel of N sub-streams, a, that are modulated to N subcarriers through an inverse fast Fourier transform (IFFT). Cyclic prefix (CP) samples are then added to each block of data to resolve and compensate for channel distortion. The length of the cyclic prefix is preferably equal to or greater than the duration of the channel impulse response. At the receiver, CP samples are removed and an FFT is applied to the remaining samples. Using the properties of DFT, one finds that the samples at the output of FFT are scaled versions of the transmitted data symbols at the IFFT input. The scaling factors here are channel gain at each subcarrier. The transmitted data symbols can thus be recovered using a set of complex gain, one attached to each output of the FFT that compensates for the channel gain.

With respect to FIG. 29, the following notations are used: a represents the serial data stream; a, a vector, represents the parallel data stream; Ha+n represents the received noisy data after demodulation; H represents a diagonal matrix with channel gains at different subcarriers along its diagonal; n represents noise vector; and â represents the estimate of a.

Figure 29A:
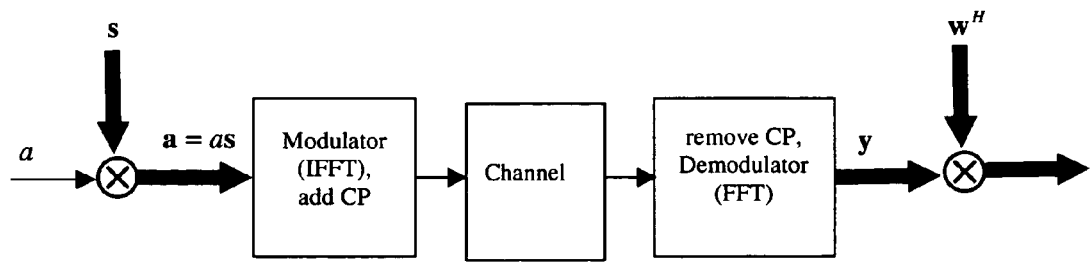
FIG. 29A is an OFDM transceiver system in accordance with an embodiment of the present invention.

FIG. 29A illustrates an OFDM transceiver system in accordance with the present invention. In FIG. 29A, a is obtained by spreading a single data symbol a over all subcarriers using the spreading code vector s. At the receiver, the demodulator output is the vector y=aHs+n. When the elements of n are iid, an estimate of the data symbol a, â, is obtained through a matched filter, $s^H H^H$, and a scaler $(s^H H^H H s)^{-1}$, forming the weight vector $w^H = (s^H H^H H s)^{-1} s^H H^H$. When the elements of n have different variances (a case than happens when a partial-band/non-white jammer exists), the elements of w are chosen so that more weight is given to the elements x that are less noisy. This is referred to as maximum ratio combining. Maximum ratio combining may be performed using knowledge of signal, noise and jammer powers in each subband. When this knowledge is may not be readily available, a sub-optimum may be used. When the channel is noise/interference free, $y_{noise\ free} = aHs$. Moreover, when that the channel is line-of-sight (a case of interest in this project), the diagonal elements of H have the same amplitude.

Accordingly, if we assume that the elements of s also have the same amplitude, we find that the amplitudes of the elements of $y_{noise\ free}$ are also the same. Now, if we consider the noisy signal vector y=aHs+n, one would expect that (on an average) the more noisy elements of y have larger amplitudes. Hence, a reasonable choice of the weight vector $w^H$ is $w^H = (s^H H^H H s)^{-1} s^H H^H A$, where A is a diagonal matrix whose diagonal elements are proportional to the inverse of the magnitude of the elements of y.

In MCSS the received signal at the FFT output is the column vector y=aHs+n. Recalling that H is a diagonal matrix, we may also write $$y = aSh + n$$

where S is a diagonal matrix with the elements of s at its diagonal, and h is the column vector whose elements are diagonal elements of H. Assuming that the symbol a and the spreading code s, and thus S, are known to the receiver, an estimate of the channel may be obtained as $$\hat{h} = a^{-1}(S^H S)^{-1} S^H y$$

The estimate ĥ is channel response in the frequency domain. Hence, applying an IFFT to ĥ will give the time domain response of the channel from which the channel delay/the desired range may be extracted. Alternatively, if the channel could be modeled as a delay, the slope of the phase of ĥ gives the channel group delay which can be translated to the distance between transmitter and receiver, i.e., the range.

This method of ranging assumes that receiver is synchronized with the transmitter. Such synchronization may be established as follows.

The base (the receiver) sends regular sync pulses to the remote (the transmitter), and the remote synchronizes the OFDM symbols with the received sync pulses. If this is done, the measured distance at the base would be twice the distance between the base abnd the remote. This can be simply divided by 2 to obtain the desired range. As for the sync pulses, they can be generated through a BPSK (for example) which occupy one of the subcarriers in OFDM. As this toggles between the two phases the positive and/or negative band edges may be used for synchronization. We note that in this configuration both sides can play the role of base, independently, and thus measure the range. Note that a (predetermined) fixed delay may be introduced by the remote in the timing of transmitted sync pulses relative to the received sync pulses which is accounted for by the base.

Figure 29B:
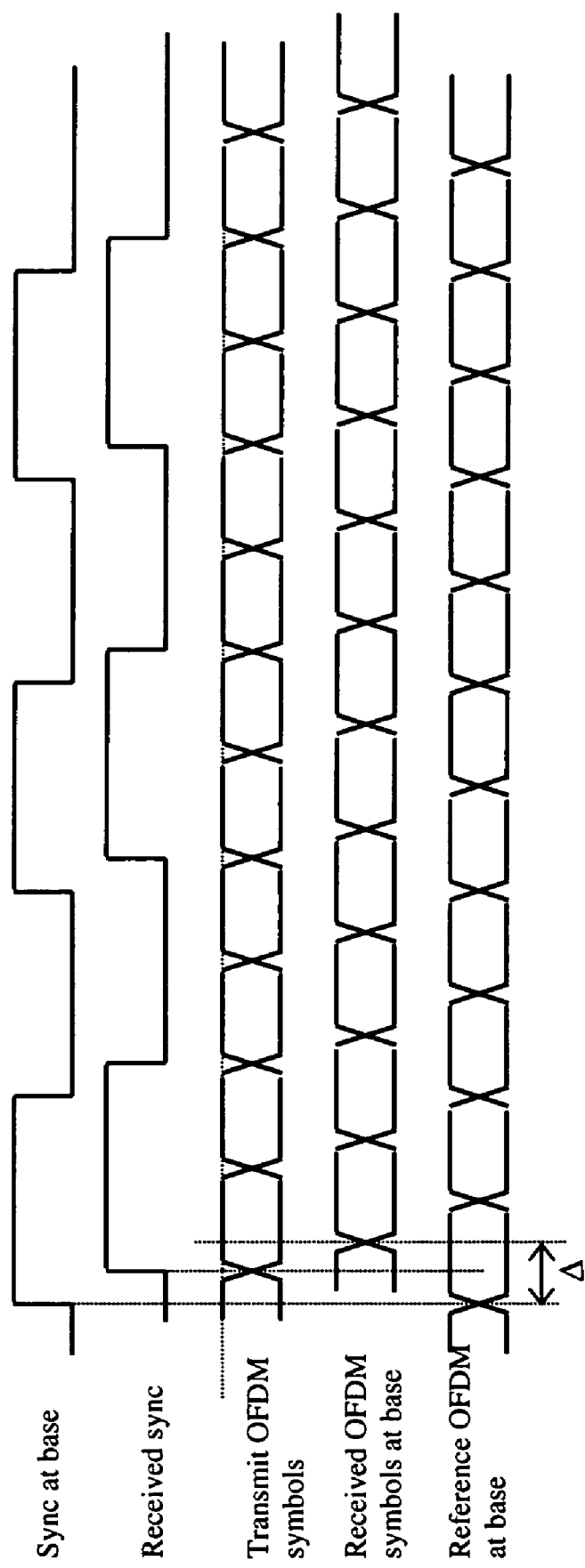
FIG. 29B is a timing diagram showing how range measurement is performed in accordance with an embodiment of the present invention.

FIG. 29B shows a timing diagram that explains how the range measurement is performed. The delay $\Delta$, measured at the base, is used to calculated the range according to the equation $$\text{Range} = \frac{c}{2\Delta}$$

where c is the speed of light. $\Delta$ is measured accurately by estimating the round trip response as discussed above. The edge of the received sync pulses should also be measured accurately. This is done by averaging over a number of sync pulses.

The range measurement strategy that was discussed above assumes that the round trip delay $\Delta$ is less than one OFDM block. To be able to measure delays of more than one OFDM block, the transmitter will regularly transmit special OFDM patterns that are known to the base and will be used for course estimate of delay in terms number of OFDM blocks. Fine estimation of delay in terms of a fraction of an OFDM block follows the procedure of channel estimation.

The use of OFDM also enables identification of the communication channel that in turn will be used for range measurement.

Various other embodiments of the presently disclosed inventive techniques will now be enumerated, aspects of these embodiments of which have been described above. These exemplary embodiments include:

1. A device for measuring a characteristic of a wire comprising:
   a sensor for measuring an electrical property associated with said wire to produce a measurement result;
   a processor configured to extract a desired wire characteristic from the measurement result of the sensor.

2. The device of example 1 wherein said sensor comprises:
   a voltage source configured to produce a varying output voltage; and
   a reference capacitor having a first and second end connected to said voltage source at the first end and configured to supply said varying output voltage to a wire under test at the second end and configured to provide a measurement result corresponding to a voltage present at the second end whereby said voltage is proportional to the capacitance of said wire.

3. The device of example 2 wherein said reference capacitor comprises a plurality of different capacitors having a predetermined capacitance value wherein a particular one of said plurality of different capacitors may be selected at a time.

4. The device of example 1, wherein said measurement result is proportional to the capacitance of said wire.

5. The device of example 1, wherein said measurement result is proportional to the inductance of said wire.

6. The device of example 1, wherein a length of said wire length is determined as a linear function of said measurement result.

7. The device of example 1, wherein said wire length is determined as a non-linear function of said measurement result.

8. The device of example 7, wherein said non-linear function is determined by calibration against a known length wire.

9. The device of Example 1, wherein said sensor comprises an oscillator circuit configured such that a frequency of oscillation is affected by an impedance of said wire and wherein said frequency of oscillation is provided as the measurement result to be used by said processor.

10. The device of example 9, further comprising: a filter configured to separate said frequency of oscillation from a signal present on said wire whereby said device may be used while said wire has a signal present associated with an operating system.

11. The device of Example 1 further comprising: a capacitor configured for insertion in series with said wire whereby disabling of said sensor is prevented in case of said wire having a short circuit.

12. The device of example 1 wherein said sensor comprises:
   a voltage source configured to output a varying voltage;
   a first amplifier coupled to said voltage source and configured to be coupled to said wire and configured to amplify said varying voltage with a gain proportional to an electrical property of said wire to produce an amplified voltage; and
   a second amplifier coupled to said voltage source and configured to accept said varying voltage and coupled to said first amplifier and configured to accept said amplified voltage and configured to generate a difference voltage proportional to a difference of said varying voltage and said amplified voltage wherein said difference voltage is provided as said measurement result whereby said difference voltage has an amplitude and a phase related to an electrical property of said wire.

13. The device of example 1, wherein the sensor comprises at least one frequency to voltage converter configured to convert a frequency measurement result to a voltage measurement result.

14. The device of example 13, wherein the sensor comprises at least two frequency to voltage converters capable of operation in different frequency ranges configured so that one of said at least two frequency to voltage converters may be configured for operation at a given time whereby an increased measurement range is obtained.

15. The device of example 1, wherein said device is packaged as a stand alone device.

16. The device of example 1, wherein said device is added to a preexisting system component.

17. The device of example 1, wherein said device is included in a multi-function measurement device.

18. The device of example 1, wherein said device is included in a laptop computer.

19. The device of example 1, wherein said device is included in a desktop personal computer.

20. The device of example 1, wherein said device is disposed within the insulation of the wire.

21. The device of example 1, wherein said device is disposed in a connector.

22. The device of example 1, wherein said device is packaged so at to be suitable for installation on a multi-function meter.

23. The device of example 1, wherein said device is configured to be installed in a circuit breaker.

24. The device of example 1, wherein said device is configured to be installed in an arc-fault breaker.

25. The device of example 1, wherein said device is configured to be installed in a battery 26. The device of example 1, wherein said device is integrated into a probe suitable for use with a multi-function meter.

27. A timer reflectometer system for determining a distance to a short circuit on a wire under test, said system comprising:
   a timing chip having a discharge pin, a threshold pin, an output pin, a trigger pin, a reset pin, a power pin, a control pin, and a ground pin;
   wherein the discharge is coupled at a common connection to a first resistor Ra, and a second resistor Rb, and wherein the second Rb is also coupled on an opposite end to a first end of the wire under test, and wherein the first resistor Ra is also coupled on an opposite end to the power pin, the reset pin, and a voltage source;
   wherein the threshold pin is coupled to resistor Rs, wherein the resistor Rs is also coupled on an opposite end to a second end of the wire under test, and to ground, and wherein the threshold pin is also coupled to the trigger pin;
   wherein the control pin is coupled to a first side of a capacitor, and wherein the capacitor is coupled on a second side to the ground pin and to ground; and
   wherein the output pin generates a frequency that is proportional to the distance to the short circuit on the wire under test.

28. The timer reflectometer system as defined in example 27 wherein the system further comprises a voltage converter for converting the frequency on the output pin to a voltage.

29. A method for detecting a short circuit on a wire under test, said method comprising the steps of:
provide a timer reflectometer system that is capable of determining a distance to a short circuit on the wire under test;
generating a frequency on an output pin of the timer reflectometer system that is proportional to the distance to the short circuit on the wire under test; and
converting the frequency on the output pin to a voltage.

30. The method of Example 29 further comprising the step of determining said distance to said short based on said voltage.

31. The method of example 30, further comprising the step of adjusting said distance based on a predetermined calibration factor associated with a type characterizing said wire under test.

32. A mixed signal reflectometer for detecting signal path integrity, comprising:
a signal generator for injecting a test signal into a signal path under test;
a detector for receiving a reflected signal from the signal path under test superimposed on the test signal; and
an analyzer configured for receiving output from the detector and analyzing the output to determine a location of anomalies in the signal path under test.

33. The mixed signal reflectometer in accordance with example 32, wherein the detector comprises:
a square law device for receiving the reflected signal from the signal path under test superimposed on the test signal and squaring the reflected signal from the signal path under test superimposed on the test signal to produce an output; and
a direct current (DC) extractor configured for receiving the output and extracting a low frequency component thereof.

34. The mixed signal reflectometer in accordance with example 32, wherein the detector comprises an amplitude detector for receiving and extracting an amplitude of the reflected signal from the signal path under test superimposed on the test signal.

35. The mixed signal reflectometer in accordance with example 32, wherein the detector comprises:
an amplitude detector configured for receiving and extracting the amplitude of the reflected signal from the signal path under test superimposed on the test signal; and
a square law device configured to accept and form the square of the amplitude.

36. The mixed signal reflectometer in accordance with example 32, wherein said analyzer is coupled to said signal generator and configured to control said analyzer based on output from the detector.

37. A method for measuring the integrity of a signal path comprising the steps of:
injecting a test signal into a signal path under test;
receiving the reflected signal from the signal path to be tested superimposed on the test signal; and
analyzing the reflected signal from the signal path under test superimposed on the test signal to determine location of anomalies in the signal path under test.

38. A spread spectrum reflectometer comprising:
a spread spectrum signal generator configured to generate a spread spectrum signal having associated with said spread spectrum signal a code and a pulse shape configured so that said spread spectrum signal may be coupled into a wire;
a correlator configured for computing a correlation result between said spread spectrum signal and a reflected version of said spread spectrum signal received from said wire whereby a property of said wire may be extracted from said correlation result.

39. The spread spectrum reflectometer of example 38 wherein said spread spectrum signal generator is configured to produce a wide bandwidth, low power signal suitable for injection into an operating system without interfering with said operating system.

40. The spread spectrum reflectometer of example 38 wherein said code is selected to be self-orthogonal.

41. The spread spectrum reflectometer of example 38 wherein said property is selected to be a delay associated with said reflected spread spectrum signal whereby a distance to an anomaly of said wire may be determined.

42. The spread spectrum reflectometer of example 38 wherein said property is selected to be a reflection coefficient associated with said reflected spread spectrum signal whereby a character of an anomaly of said wire may be determined.

43. The spread spectrum reflectometer of example 38 further comprising a modulator coupled to said spread spectrum signal generator for shifting said spread spectrum signal in frequency.

44. The spread spectrum reflectometer of example 38 further comprising a control element coupled to said correlator and configured to extract more than one property of said wire from said correlation result.

45. A hybrid time-correlator sensor for use in measuring a characteristic of a wire comprising:
a code sequence generator;
a pulse generator coupled to said code sequence generator for producing a pulse train from said code sequence;
a first timer configured to received a first sample of said pulse train and to receive a second sample of a reflected pulse train and determine a first time delay between said first and second samples;
a first matched filter configured to process said first sample;
a second matched filter configured to process said second sample; and
a second timer coupled to said first and second matched filter to determine a second time delay between said first and second sample.

46. The hybrid time-correlator of example 45 further comprising a processor for combining said first and second time delay to determine a total time delay.

47. An illuminating test probe adapted for use with a measurement instrument comprising:
a test probe body having a test connection end configured for receiving a test probe tip;
an illumination source coupled to said test probe body and configured to direct illumination towards a location proximate to said test connection whereby said illumination aids a test probe user in seeing an area where said test probe is to be used.

48. The illuminating test probe of example 47, wherein said illumination source is further configured to receive power from said measurement instrument.

49. An integrated device adapted for use with a measurement instrument having an instrument probe lead socket comprising:
a probe lead plug configured for insertion into said instrument probe lead socket;

a probe lead socket configured to receive an instrument probe lead plug; and a circuit configured to convert a first signal received from said probe lead socket to a second signal and supply said second signal to said probe lead plug whereby said measurement instrument in enhanced by enabling additional types of measurements.

50. An orthogonal frequency division multiplexing (OFDM) system comprising:

a spreader for spreading a data symbol over multiple carriers using a spreading code to produce a transmit signal containing sync pulses;

a despreader combiner configured to accept a received signal version of said transmit signal and configured for despreading said received signal to produce subcarrier estimates; and a combiner for combining said subcarrier estimates to produce an estimate of said data symbol and extract an estimate of said sync pulses.

51. An OFDM ranging system comprising:

a base configured to transmit a first OFDM signal containing at least one first sync pulse and configured to receive a second OFDM signal containing at least one second sync pulse and configured to extract at least one delay between said first sync pulse and said second sync pulse; and a remote configured to receive said first OFDM signal and extract said first sync pulse and configured to transmit said second OFDM signal with a predetermined time alignment between said first sync pulse whereby said delay is related to a range between said base and said remote.

52. The OFDM ranging system of example 51 wherein said base is further configured to extract a range by dividing said delay by two times the speed of light.

53. The OFDM ranging system of example 51 wherein said base is further configured to adjust said delay by said predetermined time alignment.

54. The OFDM ranging system of example 51 wherein more than one delay is extracted and averaged together to produce an averaged delay.

55. A noise domain reflectometer (NDR) for detecting signal path integrity, comprising:

a variable delay configured for receiving a portion of an operational system signal being injected into a signal path under test and introducing a variable time delay to produce a delayed version of an operational system signal;

a multiplier configured for multiplying the delayed version of an operational system signal by a reflected signal reflected from a signal path under test and outputting a multiplication product; and an integrator configured for integrating the multiplication product to form a correlation value for use in determining the location of discontinuities in a signal path under test.

56. A noise domain reflectometer (NDR) for detecting signal path integrity, comprising:

a variable delay configured for receiving a portion of a combined operational and reflected signal from a signal path under test and producing a delayed combined operational and reflected signal from a signal path under test;

a multiplier, configured for accepting the delayed combined operational and reflected signal, multiplying the combined operational and reflected signal by the delayed operational and reflected signal and outputting a multiplication product; and an integrator configured for integrating the multiplication product to form a correlation value for use in determining a location of discontinuities in the signal path under test.

57. An NDR in accordance with example 55 or 56 wherein the variable delay is implemented by a digital memory or digital shift register and the multiplier is implemented by an XOR, XAND, AND, or NAND digital logic gate.

58. An NDR in accordance with example 55 or 56 further comprising a delay control for changing the variable delay from a minimum value to a maximum value corresponding to a range of delays to be searched for discontinuities in a signal path under test.

59. An NDR in accordance with example 58, further comprising a rate control for controlling the rate at which the variable delay is changed so that the rate is reduced when the output of the integrator indicates discontinuities near the current delay.

60. An NDR in accordance with example 55 or 56, further comprising a noise-like signal generator connected to the signal path under test for generating a noise-like signal which is injected into a signal path under test such that the noise-like signal is superimposed on an operational system signal.

61. A noise domain reflectometer—type II (NDR-II) for detecting signal path integrity, comprising a media interface for translating a reflected signal superimposed on an operational system signal present on a signal path under test and outputting a translated superimposed signal;

a variable delay for receiving the translated superimposed signal and introducing a variable time delay to produce a delayed version of the translated superimposed signal;

a multiplier for multiplying the delayed version of the translated superimposed signal by the translated superimposed signal and outputting a multiplication product; and an integrator for integrating the multiplication product to form a correlation value for use in determining the location of discontinuities in a signal path under test.

62. An NDR-II in accordance with example 61 wherein the variable delay is implemented by a digital memory or digital shift register and the multiplier is implemented by an XOR, XAND, AND, or NAND digital logic gate.

63. An NDR-II in accordance with example 61 further comprising a delay control for changing the variable delay from a minimum value to a maximum value corresponding to a range of delays to be searched for discontinuities in a signal path under test.

64. An NDR-II in accordance with example 63, further comprising a rate control for controlling the rate at which the variable delay is changed so that the rate is reduced when the output of the integrator indicates discontinuities near the current delay.

65. A device in accordance with example 61, further comprising a noise-like signal generator connected to a signal path under test for generating a noise-like signal which is injected into a signal path under test such that the noise-like signal is superimposed on an operational system signal.

66. A method for measuring the integrity of a signal path comprising:

receiving an operational system signal and reflections from a signal path under test;

correlating an operational system signal and reflections from a signal path under test for various time delays to generate correlation values corresponding to locations of discontinuities in the signal path under test; and determining from the correlation values the location of the discontinuities.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A device for measuring a characteristic of a wire comprising:
    a sensor configured to measure a bulk electrical inductance of said wire to produce a measurement result, wherein said sensor comprises
    a voltage source configured to produce a varying output voltage, and
    a reference component having a known inductance and having a first end and a second end, the first end connected to said voltage source and the second end connected to the wire to supply said varying output voltage to the wire to provide a measurement result corresponding to a voltage present at the second end whereby said voltage is proportional to bulk inductance of said wire; and
    a processor configured to extract a length of the wire from the measurement result of the sensor.

2. The device of claim 1 wherein said wire length is determined as a linear function of said measurement result.

3. The device of claim 1, wherein said wire length is determined as a non-linear function of said measurement result.

4. The device of claim 3, wherein said non-linear function is determined by calibration against a known length wire.

5. The device of claim 1, wherein said device is added to a preexisting system component.

6. The device of claim 1, wherein said device is included in a multi-function measurement device.

7. The device of claim 1, wherein said device is included in a laptop computer.

8. The device of claim 1, wherein said device is included in a desktop personal computer.

9. The device of claim 1, wherein said device is disposed within the insulation of the wire.

10. The device of claim 1, wherein said device is disposed in a connector.

11. The device of claim 1, wherein said device is disposed in an integrated package configured as an add on device for a multi-function meter.

12. The device of claim 1, wherein said device is configured to be installed in a circuit breaker.

13. The device of claim 1, wherein said device is configured to be installed in an arc-fault breaker.

14. The device of claim 1, wherein said device is configured to be installed in a battery.

15. The device of claim 1, wherein said device is integrated into a probe.

16. A device for measuring a characteristic of a wire comprising:
    a sensor configured to measure a bulk electrical inductance of said wire to produce a measurement result; and
    a processor configured to extract a length of the wire from the measurement result of the sensor,
    wherein said sensor comprises an oscillator circuit configured such that a frequency of oscillation is controlled by the bulk inductance of said wire and wherein said frequency of oscillation is provided as the measurement result to be used by said processor.

17. The device of claim 16, further comprising a filter configured to separate said frequency of oscillation from a signal present on said wire.

18. The device of claim 16, wherein the sensor comprises at least one frequency to voltage converter configured to convert a frequency measurement result to a voltage measurement result.

19. The device of claim 18, wherein the sensor comprises at least two frequency to voltage converters capable of operation in different frequency ranges configured so that one of said at least two frequency to voltage converters is configured for operation at a given time.

20. The device of claim 16 wherein said wire length is determined as a linear function of said measurement result.

21. The device of claim 16, wherein said wire length is determined as a non-linear function of said measurement result.

22. The device of claim 21, wherein said non-linear function is determined by calibration against a known length wire.

23. The device of claim 16, wherein said device is added to a preexisting system component.

24. The device of claim 16, wherein said device is included in any one of: a multi-function measurement device, a laptop computer, and a desktop personal computer.

25. The device of claim 16, wherein said device is disposed within the insulation of the wire.

26. The device of claim 16, wherein said device is disposed in a connector.

27. The device of claim 16, wherein said device is disposed in an integrated package configured as an add on device for a multi-function meter.

28. The device of claim 16, wherein said device is configured to be installed in a circuit breaker.

29. The device of claim 16, wherein said device is configured to be installed in an arc-fault breaker.

30. The device of claim 16, wherein said device is configured to be installed in a battery.

31. The device of claim 16, wherein said device is integrated into a probe.

32. A device for measuring a characteristic of a wire comprising:
    a sensor configured to measure a bulk electrical inductance of said wire to produce a measurement result; wherein said sensor comprises:
    a voltage source configured to output a varying voltage;
    a first amplifier coupled to said voltage source and configured to be coupled to said wire and configured to amplify said varying voltage with a gain proportional to the bulk inductance of said wire to produce an amplified voltage; and
    a second amplifier;
        (i) coupled to said voltage source and configured to accept said varying voltage and
        (ii) coupled to said first amplifier and configured to accept said amplified voltage and
        (iii) configured to generate a difference voltage proportional to a difference of said varying voltage and said amplified voltage wherein said difference voltage is provided as said measurement result whereby said difference voltage has an amplitude and a phase related to the bulk impedance of said wire; and
    a processor configured to extract a length of the wire from the measurement result of the sensor.

33. A device for measuring a characteristic of a wire comprising:

a sensor configured to measure a bulk electrical inductance of said wire to produce a measurement result, wherein said sensor comprises at least two frequency to voltage converters capable of operation in different frequency ranges configured so that one of said at least two frequency to voltage converters is configured for operation at a given time; and a processor configured to extract a length of the wire from the measurement result of the sensor.

* * * * *